United States Patent
Nishihara et al.

(10) Patent No.: US 6,670,014 B2
(45) Date of Patent: Dec. 30, 2003

(54) INFORMATION RECORDING MEDIUM AND METHOD FOR PRODUCING THE SAME, AND METHOD FOR RECORDING/ REPRODUCING INFORMATION THEREON

(75) Inventors: Takashi Nishihara, Osaka (JP); Rie Kojima, Osaka (JP); Noboru Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 61 days.

(21) Appl. No.: 09/943,327

(22) Filed: Aug. 29, 2001

(65) Prior Publication Data

US 2002/0054983 A1 May 9, 2002

(30) Foreign Application Priority Data

Aug. 31, 2000 (JP) ........................................ 2000-263414

(51) Int. Cl.$^7$ ................................................ B32B 3/02
(52) U.S. Cl. .................... 428/64.1; 428/64.5; 428/64.6; 430/270.13
(58) Field of Search ............................... 428/64.1, 64.4, 428/64.5, 64.6, 913; 430/270.13, 495.1, 945; 369/283, 288

(56) References Cited

U.S. PATENT DOCUMENTS

| 5,410,534 A | 4/1995 | Nagata |
| 5,498,507 A | 3/1996 | Handa |
| 5,652,037 A | * 7/1997 | Ohkawa ..................... 428/64.1 |
| 6,143,468 A | 11/2000 | Ohno et al. |
| 6,221,455 B1 | 4/2001 | Yasuda et al. |
| 6,456,584 B1 | * 9/2002 | Nagata .................. 369/275.2 |
| 2002/0018870 A1 | * 2/2002 | Meinders .................. 428/64.1 |

FOREIGN PATENT DOCUMENTS

| EP | 0 957 477 | 11/1999 |
| JP | 10-112028 | 4/1998 |
| JP | 1-195243 | 7/1999 |
| JP | 2000-36130 | 2/2001 |
| JP | 2-147289 | 5/2001 |

OTHER PUBLICATIONS

Mar. 14, 1992, Copy of Taiwan Office Action citing above references No Date.

"Basic and Application of Optical Disk Storage" by Yoshito Tsunoda et al., The Insitute of Electronics, Information and Communication Engineers, 1995, Chapter 2 with partial English translation No Month.

"Wave Optics" by Hiro Kubota, Iwanami–Shorten, 1971, Chapter 3 with partial English translation No Month.

* cited by examiner

Primary Examiner—Elizabeth Mulvaney
(74) Attorney, Agent, or Firm—Merchant & Gould P.C.

(57) ABSTRACT

An information recording medium includes a first information layer and a second information layer. The first information layer includes a first recording layer in which a reversible phase change is caused between a crystalline phase and an amorphous phase by irradiation of a laser beam or application of current. The second information layer includes a second recording layer in which a reversible phase change is caused between a crystalline phase and an amorphous phase by the irradiation of the laser beam or the application of the current. The first recording layer is made of a first material, the second recording layer is made of a second material, and the first material is different from the second material.

8 Claims, 6 Drawing Sheets

INFORMATION RECORDING MEDIUM AND METHOD FOR PRODUCING THE SAME, AND METHOD FOR RECORDING/REPRODUCING INFORMATION THEREON

BACKGROUND OF THE INVENTION

1. Field of the Invention

The present invention relates to information recording media on which information is recorded, erased, rewritten, and reproduced optically and electrically, methods for producing the same, and methods for recording/reproducing information thereon.

2. Description of the Prior Art

There are phase-changeable information recording media as information recording media on which information is recorded, erased, rewritten and reproduced using a laser beam. Information is recorded, erased, and rewritten on the phase-changeable information recording media utilizing the phenomenon that a recording layer is changed reversibly between a crystalline phase and an amorphous phase. In general, when recording information, the recording layer is melted and cooled abruptly with irradiation of a laser beam so that the irradiated portion is changed to an amorphous phase. On the other hand, when erasing information, the recording layer is irradiated with a laser beam having a lower power than that for recording to warm the recording layer and cool it gradually, so that the irradiated portion is changed to a crystalline phase. Therefore, in the phase-changeable information media, it is possible to record or rewrite new information while erasing recorded information by irradiating the recording layer with a laser beam that changes its power between a high power level and a low power level (see "Basis and Application of Optical Disk Storage" by Tsunoda Yoshito et al., The Institute of Electronics, Information and Communication Engineers, 1995, Chapter 2).

In recent years, various techniques have been under research to provide a large capacity to information recording media. For example, a technique for achieving high density recording by using a blue-violet laser having a short wavelength or using a thin substrate on the side from which a laser beam is incident and a lens having a large numerical aperture NA to reduce the spot diameter of the laser beam is under research. Another technique under research is such that using information recording media provided with two information layers, the two information layers are recorded/reproduced with a laser beam incident from one of the two information layers (see JP 12-36130 A). This technique, which uses two information layers, can achieve about twice the recording density.

In the information recording medium including two information layers on/from which information is recorded/reproduced from one side (hereinafter, may be referred to as a "two-information-recording-layer medium), a laser beam transmitted through the information layer on the laser beam incident side (hereinafter, referred to as a "first information layer") is used to record/reproduce information on/from the information layer on the side opposite to the laser beam incident side (hereinafter, referred to as a "second information layer"). Therefore, it is preferable that the transmittance of the first information layer is at least 40%. On the other hand, it is desired that the second information layer has a high recording sensitivity (recording marks can be recorded even with a low power laser beam) with respect to the recording characteristics, and has a high reflectance with respect to the reproduction characteristics.

In order to achieve 40% of the transmittance of the laser beam through the first information layer, the first recording layer is required to have a small thickness of about 6 nm. However, if the recording layer is thin, the number of crystalline nuclei formed is small when crystallizing the recording layer. In addition, the distance over which atoms can move is short. Consequently, the crystallization rate of a thinner recording layer among recording layers made of the same material tends to be relatively lower. Therefore, as the recording layer is thinner, it is more difficult to form the crystalline phase, so that the erasure ratio is reduced.

Conventionally, as a material (phase-changeable material) of the recording layer, GeSbTe based materials having a high crystallization rate, excellent repeated rewriting performance and high reliability have been used. Using these materials, optical disks for computer data recording or optical disks for video recording have been commercialized. Among the GeSbTe based materials, quasi-binary compositions on the GeTe-$Sb_2Te_3$ line have the highest crystallization rate. The inventors of the present invention conducted recording/reproducing tests, using a red laser having a wavelength of 660 nm. The results are that in recording with a high linear velocity of 9 m/s, a satisfactory erasure ratio of 30 dB was obtained even if the recording layer made of GeTe-$Sb_2Te_3$ was as thin as 6 nm. This technique led to the feasibility of the two-information-recording-layer medium using a red laser.

Furthermore, information recording media in which a phase change is caused in the recording layer made of a phase changeable material by applying current have been under research. In these information recording media, the recording layer is interposed between two electrodes. In these information recording media, when current is allowed to flow gradually through the recording layer in an amorphous phase, the recording layer is changed to a crystalline phase at a certain threshold current, and the electrical resistance is dropped abruptly. Furthermore, the recording layer can return to the amorphous phase having a high resistance by applying a large current pulse having a short pulse width to the recording layer in the crystalline phase to melt and cool the recording layer abruptly. The difference in the electrical resistance can be detected easily by regular electrical means, and therefore such a recording layer allows a rewritable information recording medium to be obtained.

In order to provide a large capacity to information recording media, two-information-recording-layer media on which information is recorded/reproduced with a blue-violet laser having a short wavelength is desired for practical use. The spot diameter of a laser beam can be reduced by using a short wavelength laser beam or using a lens having a large numerical aperture and thus higher density recording can be achieved. For recording with a short wavelength laser beam, an information recording medium that allows a small recording mark to be formed in a satisfactory shape is required. When a blue-violet laser is used, the time during which the recording layer is irradiated with the laser beam is relatively short. Therefore, in order to form small recording marks, the recording layer is required to be formed of a material having a high crystallization rate. Furthermore, the recording layer is required to be formed of a material having a large change in the optical characteristics between the crystalline phase and the amorphous phase in order to obtain a sufficient signal amplitude even from small recording marks In the experiments of the inventors of the present invention, when a conventional two-information-recording-layer medium using a red laser was used as an information recording medium for blue-violet laser, recording marks formed in the first information layer and the second information layer were small, and thus a sufficient signal amplitude was not obtained. Regarding the first information layer, when the thickness of the recording layer was made about 6 nm to ensure a sufficient transmittance, the erasure ratio was an insufficient value of less than 15 dB. The experiments of the inventors of the present invention confirmed that a large signal amplitude can be obtained by increasing the ratio of GeTe in a quasi-binary composition on the GeTe-$Sb_2Te_3$ line. However, as the ratio of GeTe is higher, the melting point of the material tends to be higher. Therefore, as the ratio of GeTe is higher, the laser power (recording power) required for forming an amorphous phase is larger. The output of the currently available blue-violet laser is smaller than that of a red laser. Therefore, when a composition having a large ratio of GeTe was used for the second information layer on which information is recorded/reproduced with a laser beam transmitted through the first information layer, the recording power was insufficient and thus the saturated signal amplitude was not obtained.

Thus, in the two-information-recording-layer medium for use with a blue-violet laser, it is important to ensure a high erasure ratio of the first information recording layer and a high recording sensitivity of the second information recording layer.

For practical use of the two-information-recording-layer medium for use with a blue-violet laser, the first information is required to have a high transmittance and good recording and erasing performance, and the second information recording layer is required to have a high reflectance, a high recording sensitivity and good recording and easing performance. Therefore, for the practical use of the medium, it is necessary to consider materials for the first and second recording layers and the constitution of the first and second recording layers.

For materials for the recording layers in which a phase change is caused by applying current, materials containing Te as the main component is in practical use. However, conventional materials require a long time in the order of microseconds for crystallization. An electrically phase-changeable information recording medium provided with two recording layers and having good recording and erasing performance has not been in practical use yet.

SUMMARY OF THE INVENTION

Therefore, with the foregoing in mind, it is an object of the present invention to provide an information recording medium with two recording layers and having good recording and erasing performance, a method for producing the same and a method for recording/reproducing information thereon.

An information recording medium of the present invention includes a first information layer and a second information layer. The first information layer includes a first recording layer in which a reversible phase change is caused between a crystalline phase and an amorphous phase by irradiation of a laser beam or the Joule heat generated by application of current. The second information layer includes a second recording layer in which a reversible phase change is caused between a crystalline phase and an amorphous phase by the irradiation of the laser beam or the Joule heat generated by the application of the current. The first recording layer is made of a first material. The second recording layer is made of a second material. The first material is different from the second material. According to the information recording medium of the present invention, good recording/reproducing characteristics can be obtained in each of the information layers.

In the information recording medium of the present invention, the first material may contain Ge, Sb, and Te, and the second material may contain Sb, Te, and at least one element M1 selected from the group consisting of Ag, In, Ge, Sn, Se, Bi, Au and Mn. According to this embodiment, with respect to a recording medium on which information is recorded with a laser beam (which may referred to as an "optical information recording medium" in the following), an information recording medium including a first information layer having a high transmittance and a high erasure ratio and a second information layer having a high reflectance and high recording sensitivity can be obtained. In particular, this optical information recording medium is suitable for high density recording with a blue-violet laser. Furthermore, with respect to a recording medium on which information is recorded with current (which may referred to as an "electrical information recording medium" in the following), a phase change between a crystalline phase and an amorphous phase easily can be caused selectively in the first recording layer, the second recording layer or both of them.

In the information recording medium of the present invention, the first material may be a material represented by a composition formula: $Ge_aSb_bTe_{3+a}$, where $0 < a \leq 10$ and $1.5 \leq b \leq 4$. This embodiment can provide good recording/reproducing characteristics, even if the first recording layer is very thin.

In the information recording medium of the present invention, the first material may be a material represented by a composition formula: $(Ge-M2)_aSb_bTe_{3+a}$, where M2 is at least one element selected from the group consisting of Sn and Pb, and $0 < a \leq 10$ and $1.5 \leq b \leq 4$. According to this embodiment, Sn or Pb substituted for Ge of a Ge-Sb-Te ternary composition improves the crystallization performance, and thus a sufficient erasure ratio can be obtained, even if the first recording layer is very thin.

In the information recording medium of the present invention, the first material may be a material represented by a composition formula: $(Ge_aSb_bTe_{3+a})_{100-c}M3_c$, where M3 is at least one element selected from the group consisting of Si, Ti, V, Cr, Mn, Fe, Co, Ni, Cu, Se, Zr, Nb, Mo, Ru, Rh, Pd, Ag, In, Sn, Ta, W, Os, Ir, Pt, Au and Bi, and $0 < a \leq 10$, $1.5 \leq b \leq 4$, and $0 < c \leq 20$. According to this embodiment, the element M3 added to the Ge-Sb-Te ternary composition increases the melting point and the crystallization temperature of the recording layer, and thus the thermal stability of the recording layer can be improved.

In the information recording medium of the present invention, the second material may be a material represented by a composition formula: $(Sb_xTe_{100-x})_{100-y}M1_y$, where $50 \leq x \leq 95$ and $0 < b \leq 20$. According to this embodiment, since the melting point of the second recording layer is low and the difference in the refractive index between the crystalline phase and the amorphous phase is large, a second information layer having high recording sensitivity and a large difference in the reflectance between the crystalline phase and the amorphous phase can be obtained.

In the information recording medium of the present invention, in the first and second recording layers, a reversible phase change may be caused by the irradiation of a laser beam. The first information layer may be disposed closer to the side from which the laser beam is incident than the second information layer. The melting point of the second material may be lower than that of the first material. This embodiment can provide a second information layer having high sensitivity.

In the information recording medium of the present invention, in the first and second recording layers, a reversible phase change may be caused by the irradiation of a laser beam. The first information layer may be disposed closer to the side from which the laser beam is incident than the second information layer. This embodiment can provide an optical information recording medium.

In the optical information recording medium, the thickness of the first recording layer may be 9 nm or less. This embodiment increases the transmittance of the first information layer, which makes it easy for laser light to reach the second recording layer in an amount necessary for recording/reproducing the second information layer.

In the optical information recording medium, the thickness of the second recording layer may be in the range of 6 nm to 15 nm. This embodiment can provide the second recording layer with particularly high recording sensitivity. When the thickness is 6 nm or more, the light absorption amount in the recording layer can be large. When the thickness is 15 nm or less, the volume of a portion melted to form a recording mark can be small, so that the recording sensitivity can be prevented from degrading.

In the optical information recording medium, the transmittance Tc (%) of the first information layer when the first recording layer is in a crystalline phase and the transmittance Ta (%) of the first information layer when the first recording layer is in an amorphous phase satisfy $40 \leq (Tc+Ta)/2$ with respect to the laser beam having a wavelength in the range of 390 nm or more to 430 nm or less. This embodiment can provide good recording and erasing characteristics to the second information layer.

The optical information recording medium of the present invention may further include an optically separating layer disposed between the first information layer and the second information layer. The first information layer further includes a first substrate, a first lower protective layer, a first upper protective layer, and a first reflective layer. The second information layer may further include a second lower protective layer, a second upper protective layer, a second reflective layer, and a second substrate. The first substrate, the first lower protective layer, the first recording layer, the first upper protective layer, the first reflective layer, the optically separating layer, the second lower protective layer, the second recording layer, the second upper protective layer, the second reflective layer, and the second substrate may be disposed in this order from the side from which the laser beam is incident. According to this embodiment, with respect to the first and second information layers, the reflectance, the recording sensitivity, the erasing sensitivity, and the transmittance (especially of the first information layer) of each of the information layer can be optimized in accordance with the recording, erasure and reproduction conditions. Furthermore, the optical separating layer can separate the first information layer and the second information layer optically.

The optical information recording medium may further include a transparent layer disposed between the first substrate and the first lower protective layer.

The optical information recording medium may further include an interface layer disposed at at least one interface selected from the group consisting of an interface between the first lower protective layer and the first recording layer and an interface between the first upper protective layer and the first recording layer. The optical information recording medium may further include an interface layer disposed at at least one interface selected from the group consisting of an interface between the second lower protective layer and the second recording layer and an interface between the second upper protective layer and the second recording layer. The optical information recording medium may further include an interface layer disposed at at least one interface selected from the group consisting of an interface between the first upper protective layer and the first reflective layer and an interface between the second upper protective layer and the second reflective layer. According to these embodiments including the interface layer, atomic diffusion between the adjacent layers can be prevented, and an information recording medium having particularly high characteristics and reliability can be obtained.

The optical information recording medium may further include a transmittance adjusting layer for adjusting the transmittance of the first information layer between the first reflective layer and the optically separating layer. This embodiment can provide the first information layer with a particularly high transmittance.

The optical information recording medium may further include an interface layer disposed between the first reflective layer and the transmittance adjusting layer. According to this embodiment, atomic diffusion between the first reflective layer and the transmittance adjusting layer can be prevented, and an information recording medium having particularly high reliability can be obtained.

In the optical information recording medium, the thickness of the first substrate may be in the range of 10 $\mu$m to 800 $\mu$m. According to this embodiment, by changing the numerical aperture (NA) of the objective lens, the length, the width and the interval of recording marks can be optimized in accordance with the shape of the groove of the first substrate and recording, erasure and reproduction conditions. For example, when the thickness of the first substrate is 100 $\mu$m, good recording and erasing performance can be obtained with NA$\leq$0.85. When the thickness of the first substrate is 600 $\mu$m, good recording and erasing performance can be obtained with NA$\leq$0.6.

In the optical information recording medium, the thickness of the second substrate may be in the range of 400 $\mu$m to 1300 $\mu$m. According to this embodiment, by changing the NA of the objected lens, the length, the width and the interval of recording marks can be optimized in accordance with the shape of the groove of the second substrate and recording, erasure and reproduction conditions. It is preferable to select the thicknesses of the first and second substrate so that the thickness of the information recording medium is about 1200 $\mu$m. For example, when the thickness of the first substrate is 100 $\mu$m, it is preferable that the thickness of the second substrate is 1100 $\mu$m. When the thickness of the first substrate is 600 $\mu$m, it is preferable that the thickness of the second substrate is 600 $\mu$m.

The information recording medium of the present invention may further include first and second electrodes. In the first and second recording layers, a reversible phase change may be caused by the application of the current. The first recording layer, the second recording layer and the second electrode may be laminated over the first electrode in this order. This embodiment can provide an electrical information recording medium.

The electrical information recording medium may further include an intermediate electrode disposed between the first recording layer and the second recording layer. According to this embodiment, atomic diffusion between the first recording layer and the second recording layer can be prevented, so that the repetition characteristics and the reliability can be improved. Furthermore, according to this embodiment, current can be applied to either one of the first recording layer and the second recording layer.

According to another aspect of the present invention, a method for producing an information recording medium including a first information layer and a second information layer is provided. The method includes the processes of: (a) forming the first information layer; and (b) forming the second information layer. The first information layer includes a first recording layer in which a reversible phase change is caused between a crystalline phase and an amorphous phase by irradiation of a laser beam or the Joule heat generated by application of current. The second information layer includes a second recording layer in which a reversible phase change is caused between a crystalline phase and an amorphous phase by the irradiation of the laser beam or the Joule heat generated by the application of the current. The process (a) includes forming the first recording layer with a base material containing Ge, Sb, and Te. The process (b) includes forming the second recording layer with a base material containing Sb, Te, and at least one element M1 selected from the group consisting of Ag, In, Ge, Sn, Se, Bi, Au and Mn. According to this embodiment, the information recording medium of the present invention can be produced easily.

In the production method of the present invention, the first and second recording layer may be formed by sputtering using sputtering gas containing argon gas or krypton gas. This sputtering gas may further contain at least one gas selected from the group consisting of nitrogen gas and oxygen gas. This production method can provide information layers having excellent repeated recording performance.

In the production method of the present invention, the thickness of the first recording layer may be 9 nm or less. In the process (a), the first recording layer may be formed at a film formation rate in a range of 0.1 nm/sec. to 3 nm/sec. According to this embodiment, an optical information recording medium including a first recording layer with little variation in the thickness can be produced with high productivity.

In the production method of the present invention, the thickness of the second recording layer may be in the range of 6 nm to 15 nm. In the process (b), the second recording layer may be formed at a film formation rate in a range of 0.3 nm/sec. to 10 nm/sec. According to this embodiment, an optical information recording medium including a second information layer with high recording sensitivity can be produced with high productivity.

In the production method of the present invention, the process (b) may be performed before the process (a). After the process (b) and before the process (a), the method may further include the process (c) of forming an optically separating layer over the second information layer. In the process (a), the first information layer may be formed over the optically separating layer.

A first method of the present invention for recording/reproducing an information recording medium is a method for recording/reproducing the information recording medium of the present invention. With respect to the first information layer of the information recording medium, information is recorded/reproduced with a laser beam incident from the side of the first information layer. With respect to the second information layer of the information recording medium, information is recorded/reproduced with the laser beam that has passed through the first information layer. The wavelength of the laser beam is in the range of 390 nm or more and 430 nm or less. According to the first method for recording and reproduction, information can be recorded/reproduced on/from the first and second information layers of the optical information recording medium in a high density and with good reliability.

In the first method for recording and reproduction, the linear velocity of the information recording medium when recording/reproducing information may be in the range of 3 m/sec. or more and 30 m/sec. or less.

In the first method for recording and reproduction of the present invention, the laser beam may be focused by an objective lens, and the numerical aperture NA of the objective lens may be in the range of 0.5 or more and 1.1 or less. According to this embodiment, the length, the width and the interval of recording marks can be optimized in accordance with the thickness or the shape of the groove of the first and second substrates and recording and reproduction conditions.

A second method of the present invention for recording/reproducing an information recording medium is a method for recording/reproducing the information recording medium of the present invention. In the first and second recording layers of the information recording medium, a reversible phase change is caused between a crystalline phase and an amorphous phase by the Joule heat generated by application of current. An amplitude Ic, a pulse width tc, an amplitude Ia1, a pulse width ta1, an amplitude Ia2 and a pulse width ta2 satisfy the relationships: Ic<Ia2<Ia1 and ta1≦tc or ta2<tc, wherein a current pulse with the amplitude Ic and the pulse width tc is applied to the first or second recording layer to change the first or second recording layer from an amorphous phase to a crystalline phase; a current pulse with the amplitude Ia1 and the pulse width ta1 is applied to the first recording layer to change the first recording layer from a crystalline phase to an amorphous phase; and a current pulse with the amplitude Ia2 and the pulse width ta2 is applied to the second recording layer to change the second recording layer from a crystalline phase to an amorphous phase. According to this second method for recording and reproduction, in an electrical information recording medium, a phase change between a crystalline phase and an amorphous phase easily can be caused selectively in the first recording layer, the second recording layer or both of them. In the electrical information recording medium of the present invention, the phase change causes a change in the electrical resistance, and therefore this can be used as an element of a changeable and programmable circuit.

As described above, according to the information recording media of the present invention and the method for producing the same, information recording media including two recording layers and having good recording and erasing performance can be obtained.

These and other advantages of the present invention will become apparent to those skilled in the art upon reading and understanding the following detailed description with reference to the accompanying figures.

DESCRIPTION OF THE PREFERRED EMBODIMENTS

Figure 1:
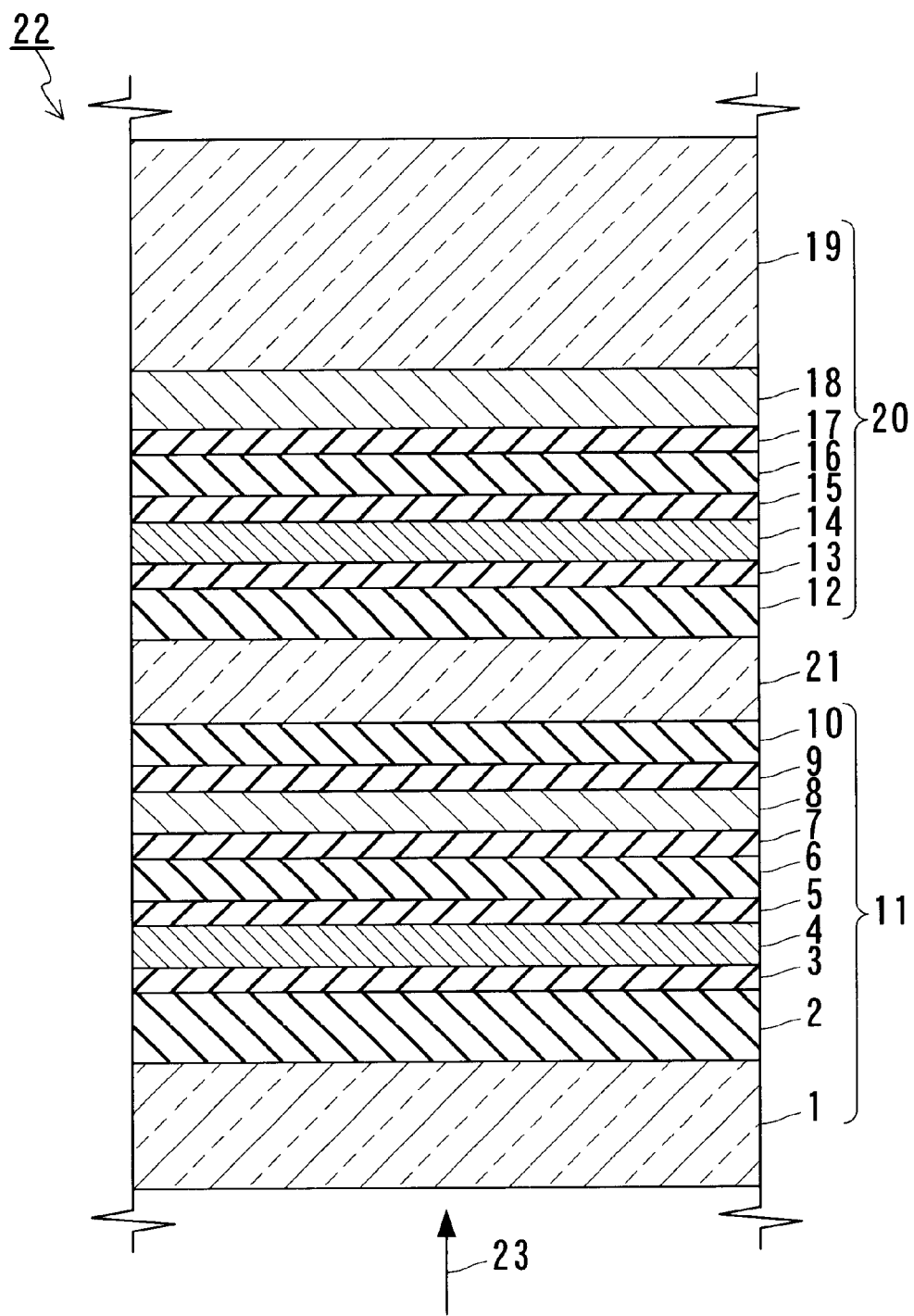
FIG. 1 is a partial cross-sectional view showing an example of an information recording medium of the present invention.

Hereinafter, the present invention will be described with reference to the accompanying drawings. The following embodiments are only examples, and the present invention is not limited thereto. In the following embodiments, the same parts bear the same reference numerals and duplicate description may be omitted.

Embodiment 1

Embodiment 1, an example of information recording media of the present invention, will be described. FIG. 1 is a partial cross-sectional view showing an information recording medium 22 of Embodiment 1. In the information recording medium 22, information is recorded/reproduced by irradiation of a laser beam 23.

Referring to FIG. 1, the information recording medium 22 includes an optically separating layer 21, a first information layer 11 and a second information layer 20 with the optically separating layer 21 interposed therebetween. The first information layer 11 is disposed closer to the side from which the laser beam 23 is incident than the second information layer 20.

The first information layer 11 includes a first substrate 1, a first lower protective layer 2, a first lower interface layer 3, a first recording layer 4, a first upper interface layer 5, a first upper protective layer 6, a first interface layer 7, a first reflective layer 8, a first uppermost interface layer 9 and a transmittance adjusting layer 10, which are disposed in this order from the side from which the laser beam 23 is incident.

The second information layer 20 includes a second lower protective layer 12, a second lower interface layer 13, a second recording layer 14, a second upper interface layer 15, a second upper protective layer 16, a second interface layer 17, a second reflective layer 18, and a second substrate 19, which are disposed in this order from the side from which the laser beam 23 is incident. For the layers named "interface layer" or "protective layer", "lower" means that the layer is positioned closer to the side from which the laser beam 23 is incident than the recording layer, and "upper" means that the layer is positioned closer to the side opposite to the side from which the laser beam 23 is incident than the recording layer.

The laser beam 23 is incident from side of the first substrate 1. Information is recorded/reproduced on/from the second information layer 20 by the laser beam 23 that has passed through the first information layer 11 and the optically separating layer 21.

The first substrate 1 and the second substrate 19 are transparent and disk-shaped. The first substrate 1 and the second substrate 19 can be formed of a resin such as polycarbonate, amorphous polyolefin and PMMA, or glass. The first substrate 1 can be formed by applying a resin to the first lower protective layer 2 and then curing the resin.

On the inner surfaces (on the surfaces facing the optically separating layer 21) of the first substrate 1 and the second substrate 19, guide grooves can be formed for guiding the laser beam, if necessary. It is preferable that the outer surfaces of these substrates are smooth. It is preferable that these substrates have a small optical birefringence in the short wavelength. As the material for these substrates, polycarbonate is particularly preferable because of good transfer properties and mass productivity and low cost. The thickness of the first substrate 1 is, for example, in the range of 10 $\mu$m to 800 $\mu$m (preferably, 50 $\mu$m to 150 $\mu$m or 550 $\mu$m to 650 $\mu$m). The thickness of the second substrate 19 is, for example, in the range of 400 $\mu$m to 1300 $\mu$m (preferably, 550 $\mu$m to 650 $\mu$m or 1050 $\mu$m to 1150 $\mu$m).

Figure 2:
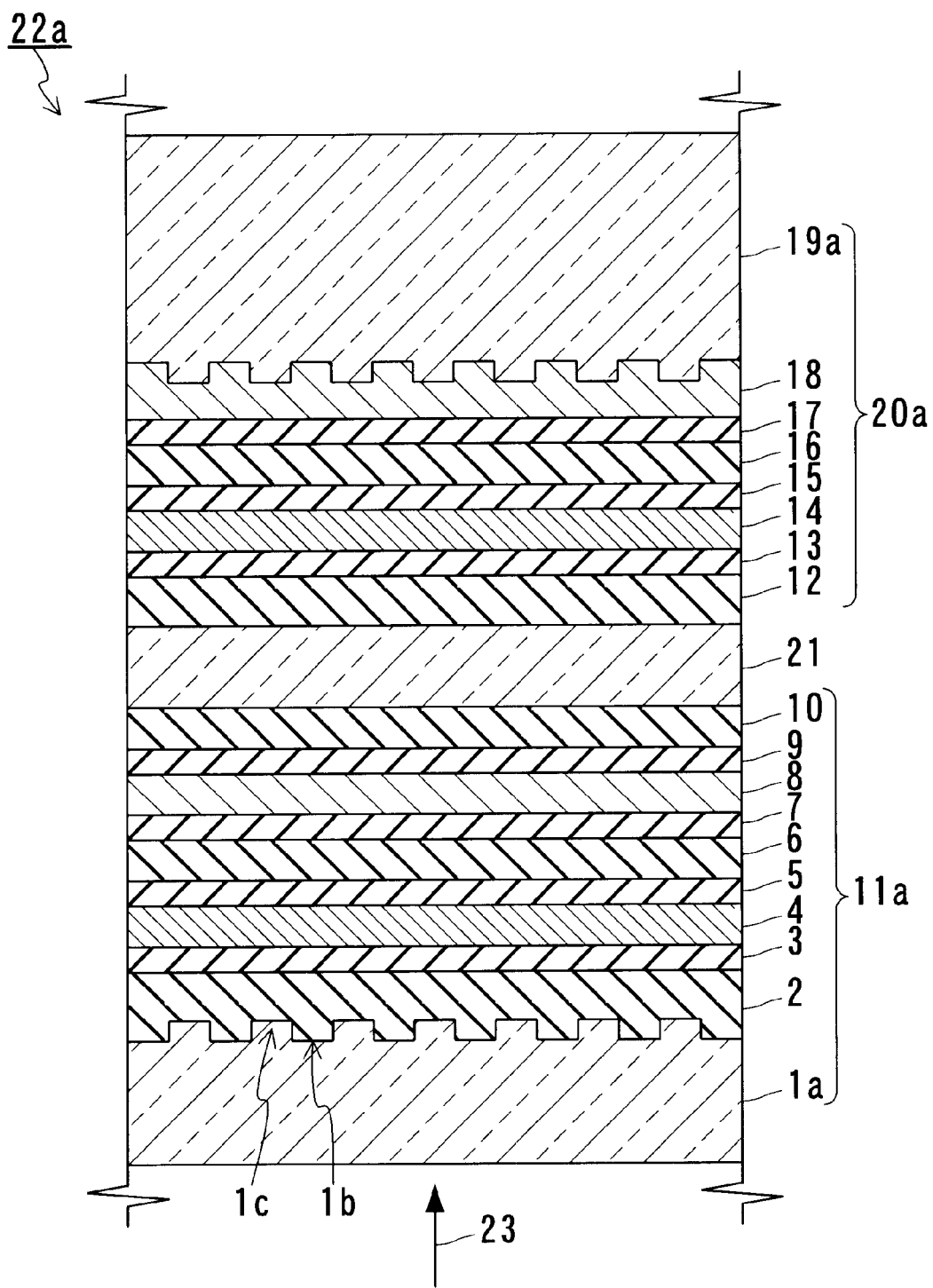
FIG. 2 is a partial cross-sectional view showing another example of an information recording medium of the present invention.

FIG. 2 shows an example of an information recording medium in which grooves for guiding the laser beam are provided both in the first substrate 1 and the second substrate 19. In the information recording medium 22a of FIG. 2, a first information layer 11a includes a first substrate 1a, and a second information layer 20a includes a second substrate 19a. In the first substrate 1a and the second substrate 19a, grooves 1b are formed. In the information recording medium 22a, information may be recorded in the grooves 1b that are the groove faces on the incident side of the laser beam 23, or may be recorded in portions between the grooves 1b (that are the groove faces farther from the incident side of the laser beam 23, and may be referred to as "lands 1c" in the following). Alternatively, information can be recorded both in the grooves 1b and the lands 1c.

The first lower protective layer 2, the first upper protective layer 6, the second lower protective layer 12, and the second upper protective layer 16 are made of dielectric. These protective layers serve to adjust the optical distance so as to raise the optical absorption efficiency of the recording layer, and to increase a change in the amount of reflected light before and after recording so as to increase the signal amplitude. For these protective layers, oxides such as $SiO_x$ (x is 0.5 to 2.5), $Al_2O_3$, $TiO_2$, $Ta_2O_5$, $ZrO_2$, $ZnO$ or Te—O can be used. Furthermore, nitrides such as Si—N, Al—N, Ti—N, Ta—N, Zr—N or Ge—N also can be used. Sulfides such as ZnS or carbides such as SiC also can be used. Mixture of the above materials can be used. Among these, ZnS—$SiO_2$, which is a mixture of ZnS and $SiO_2$ is particularly excellent as the material of the protective layer. ZnS—$SiO_2$ is an amorphous material and has a high refractive index, a high film formation rate, and good mechanical properties and moisture resistance.

The thicknesses of the first lower protective layer 2 and the first upper protective layer 6 can be determined exactly so that the following can be achieved: A change in the amount of reflected light between when the first recording layer 4 is in the crystalline phase and when it is in the amorphous phase is large; the transmittance of the first information layer 11 is large; and the light absorption efficiency of the first recording layer 4 is large. More specifically, these thicknesses can be determined, for example, using a calculation based on a matrix method.

Similarly, the thicknesses of the second lower protective layer 12 and the second upper protective layer 16 can be determined exactly so that the following can be achieved: A change in the amount of reflected light between when the second recording layer 14 is in the crystalline phase and when it is in the amorphous phase is large; and the light absorption efficiency of the second recording layer 14 is large. The first lower protective layer 2, the first upper protective layer 6, the second lower protective layer 12, and the second upper protective layer 16 can be formed of different materials or compositions, or can be formed of the same material or composition.

The transmittance adjusting layer 10 has a function to adjust the transmission of the first information layer 11. The transmittance adjusting layer 10 can increase both the transmittance Tc (%) of the first information layer 11 when the first recording layer 4 is in the crystalline phase and the transmittance Ta (%) of the first information layer 11 when the first recording layer 4 is in the amorphous phase. More specifically, in the information recording medium 22 provided with the transmittance adjusting layer 10, the transmittance of the first information layer 11 can be increased by 2% to 6% of that when the transmittance adjusting layer 10 is not provided. The transmittance adjusting layer 10 can be formed of a material as described with respect to the protective layers. In the information recording medium 22, it is preferable to satisfy 40≦(Tc+Ta)/2 (more preferably, 45≦(Tc+Ta)/2). (This applies to the information recording medium 26 of Embodiment 2.) The first lower interface layer 3, the first upper interface layer 5, the second lower interface layer 13 and the second upper interface layer 15 prevent substances from moving between the first lower protective layer 2 and the first recording layer 4, between the first upper protective layer 6 and the first recording layer 4, between the second lower protective layer 12 and the second recording layer 14, and between the second upper protective layer 16 and the second recording layer 14, respectively. In particular, these interface layers prevent substances generated by repeated recording from moving. These interface layers can be formed of, for example, nitrides such as Si—N, Al—N, Ti—N, Ta—N, Zr—N, and Ge—N, oxynitrides containing them, or carbides such as SiC. Among these, Ge—N is particularly preferable. Ge—N easily can be formed by reactive sputtering and has excellent mechanical properties and moisture resistance. When the interface layer is thick, the reflectance and the absorptance of the information layer change significantly so as to affect recording and erasing performance. Therefore, the thickness of the interface layers preferably is in the range of 1 nm to 10 nm, and more preferably in the range of 2 nm to 5 nm.

The first interface layer 7, the first uppermost interface layer 9, and the second interface layer 17 prevent substances from moving between the first upper protective layer 6 and the first reflective layer 8, between the transmittance adjusting layer 10 and the first reflective layer 8, and between the second upper protective layer 16 and the second reflective layer 18, respectively. In particular, these interface layers prevent substances generated by recording in a high temperature and high humidity atmosphere from moving. These interface layers can be formed of the materials described with respect to the first lower interface layer 3, the first upper interface layer 5, the second lower interface layer 13, and the second upper interface layer 15. The thicknesses of these interface layers preferably are in the range 1 nm to 10 nm, and more preferably in the range of 2 nm to 5 nm.

The first recording layer 4 is formed of a material in which a reversible phase change is caused between a crystalline phase and an amorphous phase by irradiation of a laser beam. The first recording layer 4 can be formed of a material containing, for example, Ge, Sb, and Te. More specifically, the first recording layer 4 can be formed of a material represented by a composition formula $Ge_aSb_bTe_{3+a}$. For this material, at a≦0, the crystalline phase is very stable, whereas the stability of the amorphous phase is insufficient. On the other hand, at 10<a, the signal amplitude is large, whereas the melting point is increased and the crystallization rate is reduced. Therefore, it is preferable to satisfy 0≦a≦10, and more preferably 1≦a≦9. Furthermore, for this material, at b<1.5, the crystalline phase is very stable, whereas the stability of the amorphous phase is insufficient. On the other hand, at 4<b, the signal amplitude is large, whereas the crystallization rate is reduced. Therefore, it is preferable to satisfy 1.5≦b≦4, and more preferably 1.5≦b≦3.

Furthermore, the first recording layer 4 may be formed of a material represented by a composition formula $(Ge-M2)_aSb_bTe_{3+a}$ (where M2 is at least one element selected from Sn and Pb). This composition formula means that the total amount of Ge and the element M2 is 100·a/(3+2a+b) atomic %. The composition of this material is obtained by substituting a part of Ge of a material represented by a composition formula $Ge_aSb_bTe_{3+a}$ with the element M2. When this material is used, the element M2 substituted for Ge improves the crystallization performance. Therefore, even if the first recording layer 4 is very thin, a sufficient erasure ratio can be obtained. Sn is more preferable as the element M2 because it is free from toxicity. When this material is used, it also is preferable to satisfy 0<a≦10 (more preferably 1≦a≦9), and 1.5≦b≦4 (more preferably 1.5≦b≦3).

The first recording layer 4 may be formed of a material represented by a composition formula $(Ge_aSb_bTe_{3+a})_{100-c}M3_c$ (where M3 is at least one element selected from Si, Ti, V, Cr, Mn, Fe, Co, Ni, Cu, Se, Zr, Nb, Mo, Ru, Rh, Pd, Ag, In, Sn, Ta, W, Os, Ir, Pt, Au and Bi). The composition of this material is obtained by adding the element M3 to a material represented by a composition formula $Ge_aSb_bTe_{3+a}$. In this case, the added element M3 increases the melting point and the crystallization temperature of the recording layer, so that the thermal stability of the recording layer can be improved. As a result, the recording/reproducing performance of the first information layer 11 can be improved. For this material, at 20<c, the crystallization rate is insufficient, so that it is preferable to satisfy 0<c≦20 and more preferably 2≦c≦10. Furthermore, it is preferable to satisfy 0<a≦10 (more preferably 1≦a≦9), and 1.5≦b≦4(more preferably 1.5≦b≦3)

The second recording layer 14 is formed of a material in which a reversible phase change is caused between a crystalline phase and an amorphous phase by irradiation of a laser beam. The second recording layer 14 is formed of a different material from that of the first recording layer 4. It is preferable that the second recording layer 14 is formed of a material having a melting point lower than that of the first recording layer 4.

The second recording layer 14 can be formed of a material comprising Sb, Te and an element M1 that is at least one selected from Ag, In, Ge, Sn, Se, Bi, Au and Mn. More specifically, the second recording layer 14 can be formed of a material represented by a composition formula $(Sb_xTe_{100-x})_{100-y}M1_y$. This material can be obtained by adding the element M1 to a Sb-Te alloy in the vicinity of the $Sb_{70}Te_{30}$ eutectic composition. When x and y satisfy 50≦x≦95 and 0<y≦20, respectively, the material has a low melting point and a high refractive index. Therefore, when the material having a composition in these ranges is used to form the second recording layer 14, the second information layer 20 having a high recording sensitivity and a high reflectance can be obtained.

At 65≦x, the crystallization rate is particularly high, and a particularly high erasure ratio can be obtained. With x≦85, the presence of a plurality of phases is suppressed, so that the deterioration of the characteristics due to repeated recording can be suppressed. Therefore, it is more preferable to satisfy $65 \leq x \leq 85$. It is preferable to add the M1 for adjusting the crystallization rate to achieve good recording/reproducing performance. It is more preferable that y is in the range $1 \leq y \leq 10$. With $y \leq 10$, the presence of a plurality of phases is suppressed, so that the deterioration of the characteristics due to repeated recording can be suppressed.

Table 1 shows the measurement results of the refractive index, the extinction coefficient, and the melting point of $(Ge_{0.74}Sn_{0.26})_8Sb_2Te_{11}$, $(Sb_{0.7}Te_{0.3})_{95}Ge_5$, and $(Sb_{0.7}Te_{0.3})_{90}Ag_5In_5$. The refractive index and the extinction coefficient were obtained by measuring samples of 10 nm layers made of the above-described material formed on a quartz substrate with a spectroscope. The melting point was measured by a differential scanning calorimeter (DSC method).

TABLE 1

| Material of recording layer | Refractive index | | | Extinction coefficient | | | Melting point |
| --- | --- | --- | --- | --- | --- | --- | --- |
| | $n_c$ | $n_a$ | $\Delta n$ | $k_c$ | $k_a$ | $\Delta k$ | [° C.] |
| $(Ge_{0.74}Sn_{0.26})_8Sb_2Te_{11}$ | 2.0 | 3.5 | −1.5 | 3.0 | 2.3 | 0.7 | 600 |
| $(Sb_{0.7}Te_{0.3})_{95}Ge_5$ | 1.8 | 3.5 | −1.7 | 3.3 | 2.6 | 0.7 | 560 |
| $(Sb_{0.7}Te_{0.3})_{90}Ag_5In_5$ | 1.7 | 3.3 | −1.6 | 3.3 | 2.7 | 0.6 | 540 |

In Table 1, $n_c$ denotes the refractive index when the sample layer is in the crystalline phase. $n_a$ denotes the refractive index when the sample layer is in the amorphous phase. $\Delta n$ is $n_c - n_a$ and denotes a change in the refractive index between when the sample layer is in the crystalline phase and when the sample layer is in the amorphous phase. $k_c$ denotes the extinction coefficient when the sample layer is in a crystalline phase. $k_a$ denotes the extinction coefficient when the sample layer is in an amorphous phase. $\Delta k$ is $k_c - k_a$ and denotes a change in the extinction coefficient between when the sample layer is in the crystalline phase and when the sample layer is in the amorphous phase.

As shown in Table 1, the extinction coefficient of $(Ge_{0.74}Sn_{0.26})_8Sb_2Te_{11}$ is about 0.3 smaller than those of $(Sb_{0.7}Te_{0.3})_{95}Ge_5$ and $(Sb_{0.7}Te_{0.3})_{90}Ag_5In_5$. $(Sb_{0.7}Te_{0.3})_{95}Ge_5$ and $(Sb_{0.7}Te_{0.3})_{90}Ag_5In_5$ are compositions obtained by adding element M1 to Sb—Te alloys in the vicinity of the $Sb_{70}Te_{30}$ eutectic composition. $(Sb_{0.7}Te_{0.3})_{95}Ge_5$ and $(Sb_{0.7}Te_{0.3})_{90}Ag_5In_5$ have melting points about 50° C. lower than that of $(Ge_{0.74}Sn_{0.26})_8Sb_2Te_{11}$ containing Sn substituted for Ge of the Ge—Sb—Te ternary composition, and have a larger absolute value of the change $\Delta n$ in the refractive index.

From the above results, as the material of the first recording layer 4, it is preferable to use Ge—Sb—Te ternary compositions or Ge—Sb—Te based compositions that can achieve a large transmittance because of their small extinction coefficients. As the material of the second recording layer 14, it is preferable to use (Sb—Te)—M1 based compositions that can achieve high recording sensitivity because of their low melting points, and can achieve a large reflectance change because of their large refractive index change $\Delta n$. Specific examples of the combination of the first recording layer 4 and the second recording layer 14 include $Ge_6Sb_2Te_9$ and $(Sb_{0.7}Te_{0.3})_{95}Ge_5$, $Ge_8Sb_2Te_{11}$ and $(Sb_{0.7}Te_{0.3})_{95}Ge_5$, and $Ge_8Sb_2Te_{11}$ and $(Sb_{0.7}Te_{0.3})_{90}Ag_5In_5$.

It is preferable that the thickness of the first recording layer 4 is 9 nm or less to increase the transmittance of the first information layer 11 so that laser light can reach the second information layer 20 in an amount necessary for recording/reproduction of the second information layer 20, and the range of 5 nm to 7 nm is more preferable.

It is preferable that the thickness of the second recording layer 14 is in the range of 6 nm to 15 nm to increase the recording sensitivity of the second information layer 20. In view of the thermal influence of the diffusion of heat in the inplane direction on the adjacent areas when the second recording layer 14 is thick, and the reduction of the reflectance of the second information layer 20 when the second recording layer 14 is thin, it is more preferable that the thickness of the second recording layer 14 is in the range of 8 nm to 12 nm.

The first reflective layer 8 and the second reflective layer 18 have an optical function to increase the amount of light absorbed by the first recording layer 4 or the second recording layer 14. These reflective layers also have a thermal function to diffuse heat generated in the first recording layer 4 or the second recording layer 14 promptly to facilitate the amorphousness of the recording layer. Furthermore, these reflective layers also have a function to protect the multilayered films from the environment in which they are used.

For the materials of the first reflective layer 8 and the second reflective layer 18, a single metal having a high heat conductivity such as Al, Au, Ag, and Cu can be used. Alternatively, alloys containing one or more of these metal elements as the main component and one or more of other elements for the purpose of improving the moisture resistance, adjusting the heat conductivity or the like can be used. Specific examples of the alloy include Al—Cr, Al—Ti, Au—Pd, Au—Cr, Ag—Pd, Ag—Pd—Cu, Ag—Pd—Ti, Ag—Ru—Au and Cu—Si. All of these alloys are excellent materials in that they have excellent corrosion resistance and satisfy the rapid cooling conditions. In particular, Ag alloys have large heat conductivity and a high transmittance of light, so that Ag alloys are preferable as the material of the first reflective layer 8.

In order to make the transmittances Tc and Ta of the first information layer 11 as high as possible, the thickness of the first reflective layer 8 preferably is in the range of 5 nm to 15 nm, and more preferably in the range of 8 nm to 12 nm. When the thickness of the first reflective layer 8 is less than 5 nm, the thermal diffusion function is insufficient, and the reflectance of the first information layer 11 is reduced. When the thickness of the first reflective layer 8 is more than 15 nm, the transmittance of the first information layer 11 is insufficient. On the other hand, the second information layer 20 does not require a high transmittance. Therefore, the thickness of the second reflective layer 18 preferably is in the range of 30 nm to 150 nm, and more preferably in the range of 70 nm to 90 nm. When the thickness of the second reflective layer 18 is less than 30 nm, the thermal diffusion function is insufficient, so that the second recording layer 14 is changed to be amorphous with difficulty. When the thickness of the second reflective layer 18 is more than 150 nm, the thermal diffusion function is too large, and therefore the recording sensitivity of the second information layer 20 is reduced.

The optically separating layer 21 is provided to distinguish the focus position of the first information layer 11 from the focus position of the second information layer 20. As the material of the optically separating layer 21, a photocurable resin or a slow-curing resin can be used. It is preferable that the material of the optically separating layer 21 has little light absorption at the wavelength of the laser beam 23 used for recording and reproduction. The thickness of the optically separating layer 21 is required to be equal to or more than the focal depth $\Delta Z$ determined by the numerical aperture NA of the objective lens and the wavelength $\lambda$ of the laser beam 23. Assuming that the reference of the intensity at the focus is 80% of the case without aberration, ΔZ can be approximated to $\Delta Z \leq \lambda/\{2(NA)^2\}$. When $\lambda \leq 400$ nm and NA≦0.6, ΔZ≦0.556 μm, and a value within ±0.6 μm is within the focal depth. Therefore, in this case, the thickness of the optically separating layer 21 is required to be 1.2 μm or more. The distance between the first information layer 11 and the second information layer 20 is required to be in the range that allows the laser beam 23 to be focused by an objective lens. Therefore, the total of the thickness of the optically separating layer 21 and the thickness of the first substrate 1 preferably is within a tolerance of the substrate thickness that is allowed by the objective lens. Therefore, the thickness of the optically separating layer 21 preferably is in the range of 1 μm to 50 μm.

The information recording medium 22 of Embodiment 1 can be produced by a method described in Embodiment 3.

Embodiment 2

Figure 3:
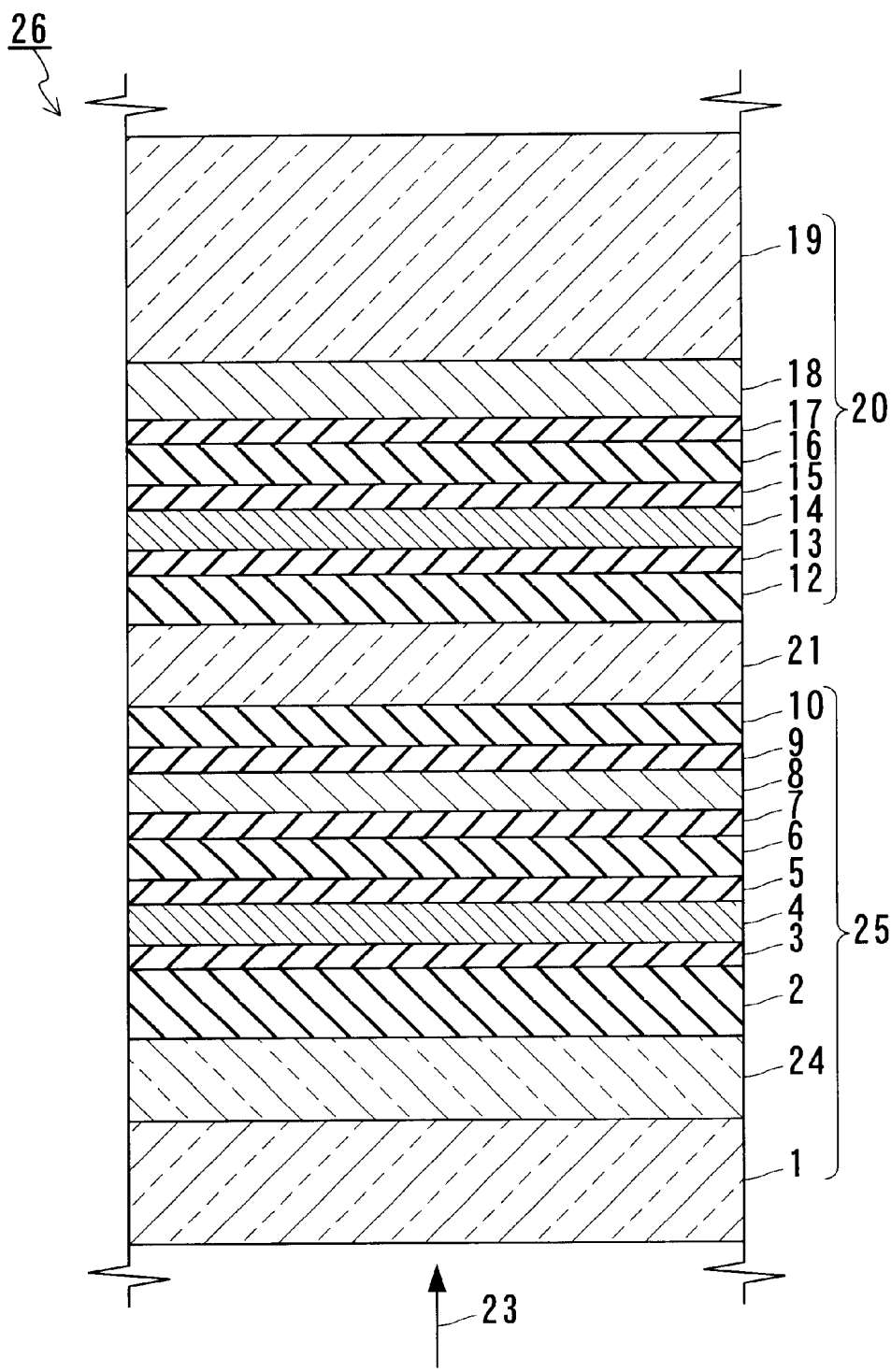
FIG. 3 is a partial cross-sectional view showing still another example of an information recording medium of the present invention.

In Embodiment 2, another example of the information recording medium of the present invention will be described. FIG. 3 is a partial cross-sectional view of an information recording medium 26 of Embodiment 2. In the information recording medium 26, recording/reproduction can be performed by irradiation of the laser beam 23.

Referring to FIG. 3, the information recording medium 26 includes an optically separating layer 21, a first information layer 25 and a second information layer 20 with the optically separating layer 21 interposed therebetween.

The first information layer 25 includes a first substrate 1, a transparent layer 24, a first lower protective layer 2, a first lower interface layer 3, a first recording layer 4, a first upper interface layer 5, a first upper protective layer 6, a first interface layer 7, a first reflective layer 8, a first uppermost interface layer 9 and a transmittance adjusting layer 10, which are disposed in this order from the side from which the laser beam 23 is incident.

The second information layer 20 includes a second lower protective layer 12, a second lower interface layer 13, a second recording layer 14, a second upper interface layer 15, a second upper protective layer 16, a second interface layer 17, a second reflective layer 18, and a second substrate 19, which are disposed in this order from the incident side of the laser beam 23.

As described in the following Embodiment 4, when producing the information recording medium 26, first, the second reflective layer 18 to the second lower protective layer 12, the optically separating layer 21, and the transmittance adjusting layer 10 to the first lower protective layer 2 are laminated on the second substrate 19 in this order. Then, the information recording medium 26 can be formed by attaching the first lower protective layer 2 and the first substrate 1 with the transparent layer 24. Alternatively, the first substrate 1 can be formed by applying a resin and curing the resin without forming the transparent layer 24.

The optically separating layer 21 and the transparent layer 24 can be formed of a photocurable resin or a slow-curing resin. It is preferable that this material has little light absorption at the wavelength of the laser beam 23 used for recording/reproduction. The thickness of each of the optically separating layer 21 and the transparent layer 24 preferably is in the range of 1 μm to 50 μm for the same reason as described in Embodiment 1.

On the surface of the optically separating layer 21 on the side of the first information layer 25, guide grooves for guiding the laser beam 23 may be formed. As in the case of the information recording medium 22 of Embodiment 1, the laser beam 23 is incident from the first substrate 1 side. In the second information layer 20, information is recorded/reproduced with the laser beam 23 that has passed through the first information layer 25 and the optically separating layer 21.

For the first substrate 1, the first lower protective layer 2, the first lower interface layer 3, the first recording layer 4, the first upper interface layer 5, the first upper protective layer 6, the first interface layer 7, the first reflective layer 8, the first uppermost interface layer 9, the transmittance adjusting layer 10, the second lower protective layer 12, the second lower interface layer 13, the second recording layer 14, the second upper interface layer 15, the second upper protective layer 16, the second interface layer 17, the second reflective layer 18, and the second substrate 19, the same layers as described in Embodiment 1 can be used. The shapes and the functions of these layers are the same as described in Embodiment 1.

Embodiment 3

In Embodiment 3, a method for producing the information recording medium 22 of the present invention will be described.

The method of Embodiment 3 includes the process of forming a first information layer 11 process (a)). More specifically, first, a first substrate 1 (having a thickness of, for example, 0.1 mm) provided with guide grooves for guiding the laser beam 23 is prepared. Next, the first substrate 1 is disposed in a film forming apparatus, and a first lower protective layer 2 is formed on the first substrate 1. At this time, when guide grooves are formed in the first substrate 1, the first lower protective layer 2 is formed on the side on which the guide grooves are formed. The first lower protective layer 2 can be formed by subjecting a base material containing metals constituting the first lower protective layer 2 to reactive sputtering in a mixed gas atmosphere of Ar gas and a reactive gas. Alternatively, the first lower protective layer 2 can be formed by sputtering a base material containing compounds in an Ar gas atmosphere or a mixed gas atmosphere of Ar gas and a reactive gas.

Then, a first lower interface layer 3 is formed on the first lower protective layer 2. The first lower interface layer 3 can be formed by subjecting a base material containing metals constituting the first lower interface layer 3 to reactive sputtering in a mixed gas atmosphere of Ar gas and a reactive gas. Alternatively, the first lower interface layer 3 can be formed by sputtering a base material containing compounds in an Ar gas atmosphere or a mixed gas atmosphere of Ar gas and a reactive gas.

Then, a first recording layer 4 is formed on the first lower interface layer 3. The first recording layer 4 can be formed by sputtering a base material containing a Ge—Sb—Te alloy, a base material containing a Ge—Sb—Te—M2 alloy, or a Ge—Sb—Te—M3 alloy, depending on its composition, with one power supply. In other words, the first recording layer 4 can be formed of a base material containing Ge, Sb, and Te.

As the atmosphere gas for sputtering (sputtering gas), Ar gas, Kr gas, a mixed gas of Ar gas and a reactive gas (at least one gas selected from oxygen gas and nitrogen gas) or a mixed gas of Kr gas and a reactive gas can be used. Alternatively, the first recording layer 4 can be formed by sputtering base materials of each of Ge, Sb, Te, and M2 or M3 simultaneously with a plurality of power supplies. Alternatively, the first recording layer 4 can be formed by sputtering a binary base material or a ternary base material containing any combinations of Ge, Sb, Te, and M2 or M3 simultaneously with a plurality of power supplies. Also in these cases, the first recording layer 4 can be formed by sputtering in an Ar gas atmosphere, a Kr gas atmosphere, a mixed gas atmosphere of Ar gas and a reactive gas, or a mixed gas atmosphere of Kr gas and a reactive gas.

It is preferable that the film formation rate of the first recording layer 4 is in the range of 0.1 nm/sec. to 3 nm/sec. As described in Embodiment 1, the thickness of the formed first recording layer 4 preferably is 9 nm or less (more preferably, 7 nm or less). The film formation rate can be controlled by the introduced power of the power supply. When the film formation rate is too low, film formation takes a long time, and gas in the atmosphere is mixed into the recording layer more than necessary. When the film formation rate is too high, although the film formation time is reduced, precise control of the thickness of the recording layer is difficult. Therefore, the film formation rate of the first recording layer 4 preferably is in the range of 0.1 nm/sec. to 3 nm/sec.

Then, a first upper interface layer 5 is formed on the first recording layer 4. The first upper interface layer 5 can be formed by the same method as in the case of the first lower interface layer 3 (This applies to the interface layers in the following). The composition of the base material used to form these interface layers can be selected based on the composition of the interface layers and the sputtering gas (This applies to the processes of forming other layers). In other words, these interface layers may be formed of the material having the same composition or these interface layers may be formed of base materials having different compositions (This applies to the processes of forming other layers).

Then, a first upper protective layer 6 is formed on the first upper interface layer 5. The first upper protective layer 6 can be formed by the same method as in the case of the first lower protective layer 2 (This applies to the protective layers in the following).

Then, a first interface layer 7 and a first reflective layer 8 are formed on the first upper protective layer 6 in this order. The first reflective layer 8 can be formed by sputtering a base material containing metals or an alloy constituting the first reflective layer 8 in an Ar gas atmosphere.

Then, a first uppermost interface layer 9 and a transmittance adjusting layer 10 are formed on the first reflective layer 8 in this order. The transmittance adjusting layer 10 can be formed by the same method as in the case of the first lower protective layer 2.

In this manner, the first information layer 11 is formed. An initialization process for crystallizing the entire surface of the first recording layer 4 may be performed, if necessary, after the transmittance adjusting layer 10 is formed. The first recording layer 4 can be crystallized by being irradiated with a laser beam.

Before or after the process (a) or parallel thereto, the second information layer 20 is formed (process (b)). More specifically, first, a second substrate 19 (having a thickness of, for example, 1.1 mm) is prepared. Then, the second substrate 19 is disposed in a film forming apparatus, and a second reflective layer 18 is formed on the second substrate 19. At this time, when guide grooves are formed in the second substrate 19, the second reflective layer 18 is formed on the side on which the guide grooves are formed. The second reflective layer 18 can be formed by sputtering a base material containing metals or an alloy constituting the second reflective layer 18 in an Ar gas atmosphere.

Then, a second interface layer 17, a second upper protective layer 16, and a second upper interface layer 15 are formed on the second reflective layer 18 in this order.

Then, a second recording layer 14 is formed on the second upper interface layer 15. The second recording layer 14 can be formed by sputtering a base material containing a Sb—Te—M1 alloy with one power supply. In other words, the second recording layer 14 can be formed of a base material containing Sb, Te, and an element M1. As the atmosphere gas for sputtering (sputtering gas), Ar gas, Kr gas, a mixed gas of Ar gas and a reactive gas (at least one gas selected from oxygen gas and nitrogen gas) or a mixed gas of Kr gas and a reactive gas can be used. Alternatively, the second recording layer 14 can be formed by sputtering base materials of each of Sb, Te, and M1 simultaneously with a plurality of power supplies. Alternatively, the second recording layer 14 can be formed by sputtering a binary base material or the like containing any combinations of Sb, Te, and M1 simultaneously with a plurality of power supplies. Also in these cases, sputtering is performed in an Ar gas atmosphere, a Kr gas atmosphere, a mixed gas atmosphere of Ar gas and a reactive gas, or a mixed gas atmosphere of Kr gas and a reactive gas.

It is preferable that the film formation rate of the second recording layer 14 is in the range of 0.3 nm/sec. to 10 nm/sec. As described in Embodiment 1, the thickness of the formed second recording layer 14 preferably is in the range of 6 nm to 15 nm. The film formation rate for the second recording layer 14 can be controlled by the introduced power of the power supply. When the film formation rate is too low, film formation takes a long time, and gas in the atmosphere is mixed into the recording layer more than necessary. When the film formation rate is too high, although the film formation time can be reduced, precise control of the thickness of the recording layer is difficult. Therefore, the film formation rate of the second recording layer 14 preferably is in the range of 0.3 nm/sec. to 10 nm/sec.

Then, a second lower interface layer 13 and a second lower protective layer 12 are formed on the second recording layer 14 in this order.

In this manner, the second information layer 20 can be formed. An initialization process for crystallizing the entire surface of the second recording layer 14 may be performed, if necessary, after the second lower protective layer 12 is formed. The second recording layer 14 can be crystallized by being irradiated with a laser beam.

Finally, the first information layer 11 and the second information layer 20 are attached via the optically separating layer 21. More specifically, first, an ultraviolet ray curable resin as the material of the optically separating layer 21 is applied to the transmittance adjusting layer 10 or the second lower protective layer 12 by spin coating, and then the first information layer 11 and the second information layer 20 are attached tightly. Thereafter, the optically separating layer 21 is cured by irradiation of ultraviolet rays from the side of the first information layer 11, and thus the information recording medium 22 can be obtained. When a slow-curing resin is used as the material of the optically separating layer 21, the irradiation of ultraviolet rays can be eliminated.

Embodiment 4

In Embodiment 4, a method for producing the information recording medium 26 will be described.

In the method of Embodiment 4, first, a second information layer 20 is formed (process (b)). More specifically, first, a second substrate 19 (having a thickness of, for example, 1.1 mm) is prepared and is disposed in a film forming apparatus.

Then, a second reflective layer 18 is formed on the second substrate 19. At this time, when guide grooves are formed in the second substrate 19, the second reflective layer 18 is formed on the side on which the guide grooves are formed. Then, a second interface layer 17, a second upper protective layer 16, a second upper interface layer 15, a second recording layer 14, a second lower interface layer 13, and a second lower protective layer 12 are formed on the second reflective layer 18 in this order. These layers can be formed by the method described in Embodiment 3.

In this manner, the second information layer 20 can be formed. An initialization process for crystallizing the entire surface of the second recording layer 14 may be performed, if necessary, after the second lower protective layer 12 is formed.

Then, an optically separating layer 21 can be formed on the second lower protective layer 12 of the second information layer 20 (process (c)). The optically separating layer 21 can be formed by spin-coating the second lower protective layer 12 with a photocurable resin or a slow-curing resin, and then curing the resin. When forming an optically separating layer 21 that includes guide grooves on its surface on the incident side of the laser beam, a substrate (mold) provided with grooves is attached to a resin that has not been cured yet, and then the resin is cured. Thereafter, the substrate (mold) is removed, and thus the guide grooves can be formed.

Then, a first information layer 25 is formed on the optically separating layer 21 (process (a)). More specifically, first, a transmittance adjusting layer 10, a first uppermost interface layer 9, a first reflective layer 8, a first interface layer 7, a first upper protective layer 6, a first upper interface layer 5, a first recording layer 4, a first lower interface layer 3, and a first lower protective layer 2 are formed on the optically separating layer 21 in this order. These layers can be formed by the method described in Embodiment 3. An initialization process for crystallizing the entire surface of the first recording layer 4 may be performed, if necessary, after the first lower protective layer 2 is formed.

Finally, the first lower protective layer 2 and the first substrate 1 are attached via the transparent layer 24. More specifically, an ultraviolet ray curable resin as the material of the transparent layer 24 is applied to the first substrate 1 or the first lower protective layer 2 by spin coating, and then the first substrate 1 and the first lower protective layer 2 are attached tightly. Thereafter, the resin is cured by irradiation of ultraviolet rays from the side of the first information layer 25, and thus the first information layer 25 disposed on the optically separating layer 21 can be formed. When the transparent layer 24 is formed of a slow-curing resin, the irradiation of ultraviolet rays can be eliminated. Thus, the information recording medium 26 can be produced.

Embodiment 5

In Embodiment 5, a method for recording/reproducing information on the information recording media of the present invention described in Embodiments 1 and 2 will be described.

Figure 4:
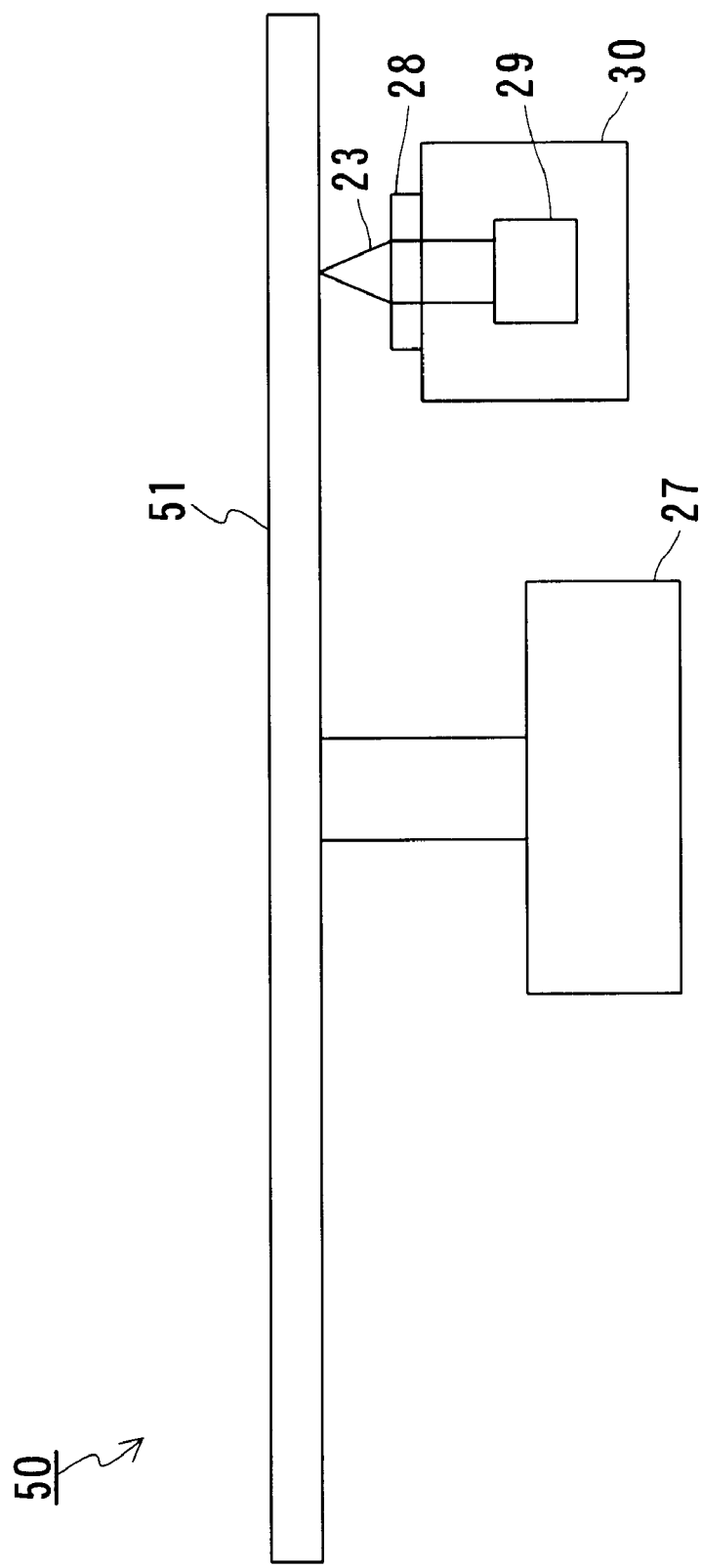
FIG. 4 is a schematic view showing a part of a configuration of a recording/reproducing apparatus used in a method for recording/reproducing information of the present invention.

FIG. 4 is a schematic view showing the configuration of a part of a recording/reproducing apparatus 50 used in the method for recording and reproduction of the present invention. Referring to FIG. 4, the recording/reproducing apparatus 50 includes a spindle motor 27 for rotating an information recording medium 51, an optical head 30 provided with a semiconductor laser 29, and an objective lens 28 for focusing the laser beam 23 emitted from the semiconductor laser 29. The information recording medium 51 is the information recording medium described in Embodiments 1 and 2, and includes the first recording layer 4 and the second recording layer 14. The objective lens 28 focuses the laser beam 23 on the first recording layer 4 or the second recording layer 14.

The numerical aperture NA of the objective lens 28 preferably is 0.5 or more and 1.1 or less (more preferably, 0.6 or more and 1.0 or less). The wavelength of the laser beam 23 preferably is 350 nm or more and 500 nm or less (more preferably, 390 nm or more and 430 nm or less). The linear velocity of the information recording medium for recording information preferably is 3 m/sec. or more and 30 m/sec. or less (more preferably, 4 m/sec. or more and 15 m/sec. or less).

Information is recorded by modulating the power of the laser beam 23 between a peak power (Pp(mW)) with a high power and a bias power (Pb(mW)) with a low power. An amorphous phase is formed by irradiation of the laser beam 23 with a peak power, and this amorphous phase corresponds to a recording mark. Portions between recording marks are irradiated with the laser beam 23 with a bias power so as to form a crystalline phase.

For recording on the first information layer 11 or 25, the laser beam 23 is focused on the first recording layer 4 to record information on the first recording layer 4. For reproduction, the laser beam 23 reflected from the first recording layer 4 is used. For recording on the second information layer 20, the laser beam 23 is focused on the second recording layer 14 and information is recorded with the laser beam transmitted through the first information layer 11 or 25 and the optically separating layer 21. For reproduction, the laser beam 23 that is reflected by the second recording layer 14 and transmitted through the optically separating layer 21 and the first information layer 11 or 25 is used.

In the case where any one of the first substrate 1, the optically separating layer 21 and the second substrate 19 of the information recording medium to be recorded/reproduced is provided with grooves 1$b$, information can be recorded either in the grooves 1$b$ or the lands 1$c$. Furthermore, information can be recorded both in the grooves 1$b$ and the lands 1$c$. Information can be recorded in the same portions (grooves, lands, or grooves and lands) or different portions of the first information layer 11 or 25 and the second information layer 20.

Embodiment 6

Figure 5:
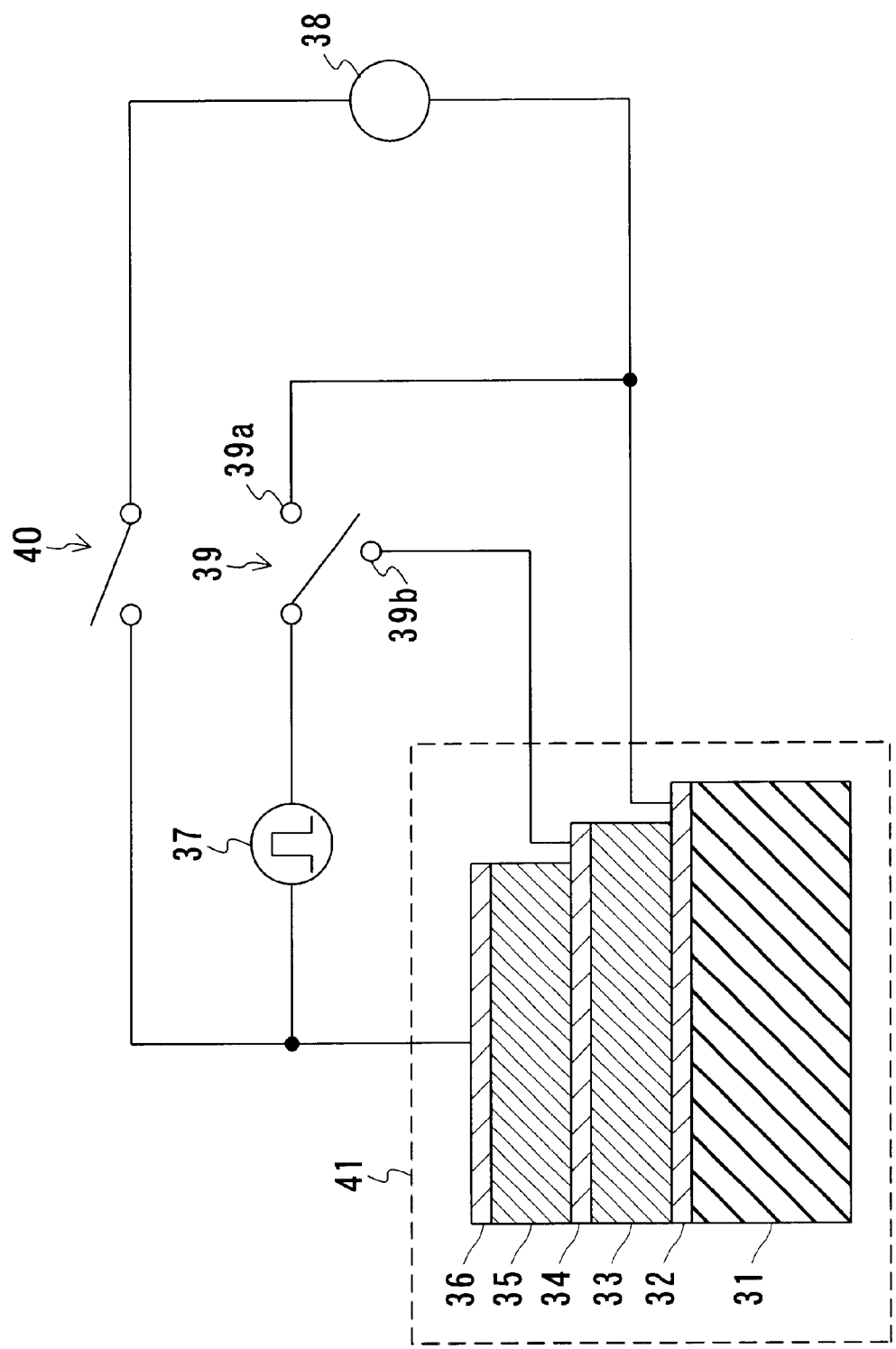
FIG. 5 is a schematic view showing another example of the information recording medium of the present invention and an example of an apparatus for recording/reproducing information thereon.

In Embodiment 6, another example of the information recording medium of the present invention will be described. FIG. 5 is a partial cross-sectional view of an information recording medium 41 of Embodiment 6. In the information recording medium 41, information is recorded by applying electrical energy, more specifically, applying a current pulse.

Referring to FIG. 5, the information recording medium 41 includes a substrate 31, a first electrode 32, a first recording layer 33, an intermediate electrode 34, a second recording layer 35, and a second electrode 36, which are laminated on the substrate 31 in this order. The first recording layer 33 constitutes the first information layer. The second recording layer 35 constitutes the second information layer.

As the substrate 31, a resin substrate made of a resin such as polycarbonate, a glass substrate, a ceramic substrate made of ceramics such as $Al_2O_3$, a Si substrate, or a metal substrate made of various types of metals (e.g., copper) can be used. When the substrate 31 has conductivity, the substrate 31 can be used as the first electrode 32. Hereinafter, the case where an insulating substrate is used as the substrate 31 will be described.

The information recording medium 41 can be produced by laminating the first electrode 32, the first recording layer 33, the intermediate electrode 34, the second recording layer 35, and the second electrode 36 on the substrate 31 in this order. The composition of the first recording layer 33 and the method for forming that layer are the same as those of the first recording layer 4 described in Embodiments 1 and 3. The composition of the second recording layer 35 and the method for forming that layer are the same as those of the second recording layer 14 described in Embodiments 1 and 3. In the first recording layer 33 and the second recording layer 35, a reversible phase change is caused between the crystalline phase and the amorphous phase by the Joule heat generated by applying current.

As the material of the first electrode 32, the intermediate electrode 34, and the second electrode 36, a single metal such as Al, Au, Ag, Cu, Pt, Ti, and W can be used. Alternatively, alloys containing one or a plurality of these metal elements as the main component and one or a plurality of other elements for the purpose of improving the moisture resistance, adjusting the heat conductivity or the like can be used. The first electrode 32, the intermediate electrode 34, and the second electrode 36 can be formed by sputtering base materials containing metals or alloys constituting these electrodes in an Ar gas atmosphere.

Hereinafter, a method for recording/reproducing information on the information recording medium 41 will be described. A pulse power supply 37 is connected between the first electrode 32 and the second electrode 36, and between the intermediate electrode 34 and the second electrode 36 via a switch 39. A resistance meter 38 is connected between the first electrode 32 and the second electrode 36 via a switch 40.

In the information recording medium 41, information is recorded by causing a phase change between the amorphous phase and the crystalline phase in the first recording layer 33 and the second recording layer 35. Information is reproduced by utilizing the fact that the resistance in the recording layer in the amorphous phase is higher than that of the recording layer in the crystalline phase. More specifically, information is reproduced by measuring the resistance of the first recording layer 33 and the second recording layer 35.

When changing the first recording layer 33 from the amorphous phase (high resistance state) to the crystalline phase (low resistance state), the switch 39 closes toward a terminal 39a (the switch 40 opens) to apply a current pulse between the first electrode 32 and the second electrode 36. In this case, the material of the first recording layer 33 has a lower crystallization temperature and a longer crystallization time than that of the second recording layer 35. Therefore, the phase change can be caused only in the first recording layer 33 by adjusting the amplitude or the pulse width of the current pulse to be applied.

For changing the second recording layer 35 from the amorphous phase to the crystalline phase, the switch 39 closes toward a terminal 39b (the switch 40 opens) to apply a current pulse between the intermediate electrode 34 and the second electrode 36. For returning the recording layer from the crystalline phase to the amorphous phase, a current pulse with a high amplitude (current value) relative to that applied to attain the crystalline phase is applied in a shorter time.

More specifically, to change the first recording layer 33 (or the second recording layer 35) from the amorphous phase to the crystalline phase, a current pulse with an amplitude Ic and a pulse width tc is applied to the first recording layer 33 (or the second recording layer 35). To change the first recording layer 33 from the crystalline phase to the amorphous phase, a current pulse with an amplitude Ia1 and a pulse width ta1 is applied to the first recording layer 33. To change the second recording layer 35 from the crystalline phase to the amorphous phase, a current pulse with an amplitude Ia2 and a pulse width ta2 is applied to the second recording layer 35. Herein, it is preferable that these amplitudes and pulse widths satisfy the relationships: Ic<Ia2<Ia1 and ta1≦tc or ta2≦tc.

The resistances of the first recording layer 33 and the second recording layer 35 are measured with the resistance meter 38 with the switch 40 closed (the switch 39 opened). Recorded information can be read out by measuring the resistances of the second recording layer 33 and the second recording layer 35.

Figure 6:
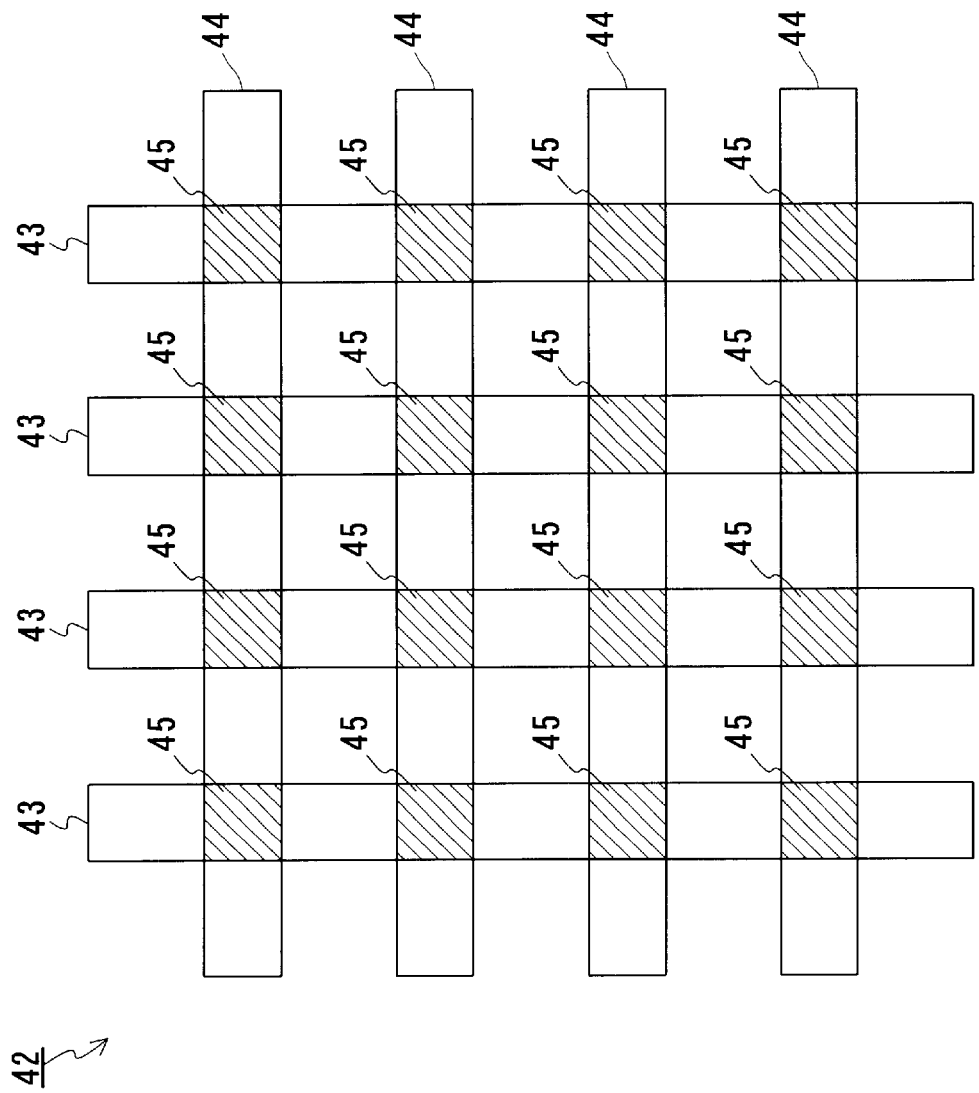
FIG. 6 is a schematic view showing a part of a configuration of another example of the information recording medium of the present invention.

A rewritable memory with a large capacity can be obtained by arranging a large number of the information recording media 41 in a matrix. FIG. 6 shows an example of the configuration of such an information recording medium.

Referring to FIG. 6, the information recording medium 42 includes a plurality of word lines 43 arranged in a stripe, a plurality of bit lines 44 arranged in a stripe, and a plurality of memory cells 45. The word lines 43 and the bit lines 44 are electrical lines for applying a current pulse and measuring the resistance. The word lines 43 and the bit lines 44 are arranged orthogonally. The memory cells 45 are arranged so as to be sandwiched by the word lines 43 and the bit lines 44 in the intersections of the word lines 43 and the bit lines 44 (shown by hatching in FIG. 6). For the memory cells 45, the information recording medium 41 without the intermediate electrode 34 can be used.

In the information recording medium 42, information can be recorded by changing a voltage across the word lines 43 and the bit lines 44 to apply a current pulse to the memory cells.

Hereinafter, a method for recording/reproducing information on the information recording medium without the intermediate electrode 34 will be described. To change the first recording layer 33 to the crystalline phase, a current pulse with an amplitude of Ic1 and a pulse width tc1 is applied. To change the second recording layer 35 to the crystalline phase, a current pulse with an amplitude of Ic2 and a pulse width tc2 is applied. To change the first recording layer 33 to the amorphous phase, a current pulse with an amplitude of Ia1 and a pulse width ta1 is applied. To change the second recording layer 35 to the amorphous phase, a current pulse with an amplitude of Ia2 and a pulse width ta2 is applied.

The temperature Tx1 at which the material of the first recording layer 33 changes from the amorphous phase to the crystalline phase is lower than the temperature Tx2 at which the material of the second recording layer 35 changes from the amorphous phase to the crystalline phase (Tx1<Tx2). The time tx1 required for the material of the first recording layer 33 to change from the amorphous phase to the crystalline phase is longer than the time tx2 required for the material of the second recording layer 35 to change from the amorphous phase to the crystalline phase (tx2<tx1). Therefore, the recording layers can be crystallized selectively by allowing the amplitude Ic1, the pulse width tc1, the amplitude Ic2 and the pulse width tc2 to satisfy Ic1<Ic2 and tc1>tc2. The two recording layers can be crystallized simultaneously by applying the current pulse with the amplitude Ic2 and the pulse width tc1 to the first recording layer 33 and the second recording layer 35.

The melting point of the material of the first recording layer 33 is higher than that of the material of the second recording layer 35. Therefore, only the second recording layer 35 can be changed to the amorphous phase by reducing ta2 and satisfying Ia1>Ia2. On the other hand, in the case where the pulse width ta1 is short, when the current pulse with the amplitude Ia1 and the pulse width ta1 is applied, the two recording layers are changed to the amorphous phase. In this case, only the first recording layer 33 can be in the amorphous phase by crystallizing only the second recording layer 35.

Hereinafter, a method for determining the state of the recording layers will be described. The total of the resistances of the two recording layers are Ra1+Ra2, Ra1+Rc2, Rc1+Ra2, or Rc1+Rc2, depending on the states of the two recording layers, where Ra1 is the resistance when the first recording layer 33 is in the amorphous phase, Rc1 is the resistance when the first recording layer 33 is in the crystalline phase, Ra2 is the resistance when the second recording layer 35 is in the amorphous phase, and Rc2 is the resistance when the second recording layer 35 is in the crystalline phase. When Ra1 is different from Ra2, and Rc1 and Rc2 are much smaller than Ra1 and Ra2, then the states of the recording layers can be determined easily based on the resistances. Thus, the four different states of the recording layers, that is, binary information, can be detected by one measurement of the resistances.

EXAMPLES

Hereinafter, the present invention will be described more specifically by way of examples.

Example 1

In Example 1, the transmittance of the first information layer 11 of the information recording medium 22 of FIG. 1 was measured to examine the effect of the transmittance adjusting layer 10.

First, samples for transmittance measurement were produced. More specifically, the first information layer 11 was produced, and the first information layer 11 and the second substrate 19 were attached via the optically separating layer 21 to produce samples.

On the other hand, as comparative examples, samples without the transmittance adjusting layer 10 were produced, and the transmittance was measured. These comparative examples were produced in the following manner. First a polycarbonate substrate (a diameter of 120 mm and a thickness of 0.6 mm) was prepared as the first substrate 1. Then, a ZnS—$SiO_2$ layer ($SiO_2$:20 mol %) as the first lower protective layer 2, a GeN layer (thickness of 5 nm) as the first lower interface layer 3, a $(Ge_{0.74}Sn_{0.26})_8Sb_2Te_{11}$ layer (thickness of 6 nm) as the first recording layer 4, a GeN layer (thickness of 5 nm) as the first upper interface layer 5, a ZnS—$SiO_2$ layer ($SiO_2$:20 mol %) as the first upper protective layer 6, a GeN layer (thickness of 5 nm) as the first interface layer 7, and an Ag alloy layer (thickness of 10 nm) as the first reflective layer 8 were laminated on the polycarbonate substrate in this order by sputtering. In this manner, the samples of the comparative examples were produced.

When forming samples provided with the transmittance adjusting layer 10, a GeN layer (thickness of 3 nm) as the first uppermost interface layer 9 and a ZnS—$SiO_2$ layer (thickness of about 30 nm, $SiO_2$:20 mol %) as the transmittance adjusting layer 10 were laminated on the first reflective layer 8 in this order by sputtering. Then, an ultraviolet ray curable resin as the material of the optically separating layer 21 was applied to the second substrate 19 by spin coating. Then, the first information layer 11 was attached onto the resin, and the resin was cured by irradiation of ultraviolet rays. In this manner, the samples for transmittance measurement were produced.

The thicknesses of the first lower protective layer 2 and the first upper protective layer 6 were determined exactly from calculations based on a matrix method (see "Wave Optics" by Hiro Kubota, Iwanami-shoten, 1971, Chapter 3). More specifically, these thicknesses were determined such that the following was achieved: A change in the amount of reflected light at a wavelength of 405 nm between when the first recording layer 4 was in the crystalline phase and when it was in the amorphous phase was large; the transmittance of the first information layer 11 was large; and the light absorption efficiency of the first recording layer 4 was large. The thickness of the transmittance adjusting layer 10 was determined exactly such that the following was achieved: The transmittance of the first information layer 11 was large without reducing the difference in the amount of reflected light between when the first recording layer 4 was in the crystalline phase and when it was in the amorphous phase and without reducing the light absorption efficiency of the first recording layer 4.

With respect to the thus obtained samples, the transmittance Ta (%) when the first recording layer 4 was in the amorphous phase was measured. Thereafter, an initialization process for crystallizing the first recording layer 4 was conducted and then the transmittance Tc (%) when the first recording layer 4 was in the crystalline phase was measured. For the measurement, a spectrometer was used to specify the values as the transmittance at a wavelength of 405 nm. After the measurement, (Tc+Ta)/2 was calculated.

Table 2 shows the measurement results of the transmittance. In the first information layers 11 of samples 2-1 and 2-3 in Table 2, the reflectance when the recording layer is in the crystalline phase is higher than that when the recording layer is in the amorphous phase. The samples 2-1 and 2-3 have substantially the same reflectance when the recording layer is in the crystalline phase. In the first information layers 11 of samples 2-2 and 2-4, the reflectance when the recording layer is in the amorphous phase is higher than that when the recording layer is in the crystalline phase. The samples 2-2 and 2-4 have substantially the same reflectance when the recording layer is in the amorphous phase.

TABLE 2

| Sample No. | Transmittance adjusting layer 10 | Tc [%] | Ta [%] | (Tc + Ta)/2 [%] |
|---|---|---|---|---|
| 2-1 | not provided | 40 | 40 | 40 |
| 2-2 | not provided | 46 | 40 | 43 |
| 2-3 | provided | 48 | 46 | 47 |
| 2-4 | provided | 48 | 42 | 45 |

As shown in Table 2, in the first information layers 11 of the samples 2-3 and 2-4 provided with the transmittance adjusting layers 10, the value of (Tc+Ta)/2 was improved by about 2% to 6% without reducing the reflectance, compared with the first information layers 11 of the samples 2-1 and 2-2 without the transmittance adjusting layer 10. Therefore, it is preferable that the first information layer 11 includes the transmittance adjusting layer 10.

As a result of measuring the transmittance of the first information layer 25 of the information recording medium 26 of FIG. 2 in the same manner, it was confirmed that the transmittance adjusting layer 10 has the same effect.

Example 2

In Example 2, the relationship between the characteristics of the first information layer 11 and the thickness of the first recording layer 4 was examined. More specifically, the first information layers 11 including the first recording layer 4 having varied thicknesses were produced, and the first information layers 11 and the second substrates 19 were attached via the optically separating layers 21 to produce samples. With respect to the formed samples, the erasure ratio, the carrier to noise ratio (CNR) and the transmittance of the first information layers 11 were measured.

A method for producing the samples will be described below. First, a polycarbonate substrate (a diameter of 120 mm and a thickness of 0.6 mm) was prepared as the first substrate 1. Then, a ZnS—SiO$_2$ layer (thickness of about 40 nm, SiO$_2$:20 mol %) as the first lower protective layer 2, a GeN layer (thickness of 5 nm) as the first lower interface layer 3, a (Ge$_{0.74}$Sn$_{0.26}$)$_8$Sb$_2$Te$_{11}$ layer (thickness of 4 nm to 10 nm) as the first recording layer 4, a GeN layer (thickness of 5 nm) as the first upper interface layer 5, a ZnS—SiO$_2$ layer (thickness of about 5 nm, SiO$_2$:20 mol %) as the first upper protective layer 6, a GeN layer (thickness of 5 nm) as the first interface layer 7, an Ag alloy layer (thickness of 10 nm) as the first reflective layer 8, a GeN layer (thickness of 5 nm) as the first uppermost interface layer 9 and a ZnS—SiO$_2$ layer (thickness of about 30 nm, SiO$_2$:20 mol %) as the transmittance adjusting layer 10 were laminated on the polycarbonate substrate in this order by sputtering. Thereafter, an initialization process for crystallizing the entire surface of the first recording layer 4 was performed. Thus, the first information layer 11 was produced.

Next, an ultraviolet ray curable resin as the material of the optically separating layer 21 was applied to the second substrate 19 by spin coating. Then, the first information layer 11 was attached onto the resin, and the resin was cured by irradiation of ultraviolet rays. In this manner, a plurality of samples including the first recording layer 4 having different thicknesses were produced.

With respect to the thus produced samples, the transmittance of the first information layer 11 was measured in the same manner as in Example 1. The erasure ratio and the CNR of the first information layer 11 were measured with the apparatus shown in FIG. 4. In this case, the wavelength of the laser beam 23 was 405 nm, the NA of the objective lens 28 was 0.65, the linear velocity of the samples at measurement was 8.6 m/s, and the shortest mark length was 0.294 μm. Information was recorded in grooves.

The CNR was measured with a spectrum analyzer after a 8–16 modulation 3T signal was recorded 10 times. The erasure performance was evaluated as follows. The amplitude was measured after a 3T signal was recorded 10 times. Then, a 11T signal was overwritten and the amplitude of the 3T signal was measured again. Thereafter, the attenuation ratio of the 3T signal was calculated. Hereinafter, this attenuation ratio is referred to as the "erasure ratio".

Table 3 shows the measurement results of the erasure ratio and the CNR of the first information layer 11 and the calculation results of (Tc+Ta)/2.

TABLE 3

| Sample No. | Thickness of first recording layer 4 [nm] | (Tc + Ta)/2 [%] | CNR | Erasure ratio |
|---|---|---|---|---|
| 3-1 | 4 | A | C | C |
| 3-2 | 6 | B | B | B |
| 3-3 | 9 | C | B | B |
| 3-4 | 10 | D | B | B |

A to D in Table 3 indicate the values of (Tc+Ta)/2, the CNR and the erasure ratio. To be specific, regarding (Tc+Ta)/2, D<30%, 30%≦C≦40%, 40%≦B<50%, and 50%≦A. Regarding the CNR, 40 (dB)≦C<50 (dB), and 50 (dB)≦B. Regarding the erasure ratio, 20 (dB)≦C<30 (dB), and 30 (dB)≦B. It is preferable that in the first information layer 11, the value of (Tc+Ta)/2 is 30% or more, and more preferably 40% or more. The CNR preferably is 40 dB or more, and more preferably 50 dB or more. The erasure ratio preferably is 20 dB or more, and more preferably 30 dB or more.

As shown in Table 3, in the sample 3-1 (thickness of the first recording layer 4: 4 nm), the transmittance was sufficient, but the CNR and the erasure ratio were insufficient. In the sample 3-4 (thickness of the first recording layer 4: 10 nm), the CNR and the erasure ratio were high, but the transmittance was less than 30%. In the sample 3-2 (thickness of the first recording layer 4: 6 nm) and the sample 3-3 (thickness of the first recording layer 4: 9 nm), good results of a transmittance of 35% to 45%, a CNR of 50 dB, and an erasure ratio of 30 dB were obtained. From the above results, the thickness of the first recording layer 4 preferably is 9 nm or less.

With respect to the first information layer 25 of the information recording medium 26 of FIG. 2, the erasure ratio, the CNR and the transmittance were measured in the same manner. The same results as above were obtained.

Example 3

In Example 3, the relationship between the characteristics of the first information layer 11 and the material of the first recording layer 4 was examined. More specifically, the first information layers 11 including the first recording layer 4 having varied compositions were produced, and the first information layers 11 and the second substrates 19 were attached via the optically separating layers 21 to produce samples. With respect to the formed samples, the CNR, the erasure ratio and the transmittance of the first information layers 11 were measured.

A method for producing the samples will be described below. First, a polycarbonate substrate (a diameter of 120 mm and a thickness of 0.6 mm) was prepared as the first substrate 1. Then, a ZnS—SiO$_2$ layer (thickness of about 40 nm, SiO$_2$:20 mol %) as the first lower protective layer 2, a GeN layer (thickness of 5 nm) as the first lower interface layer 3, a first recording layer 4 (thickness of 6 nm), a GeN layer (thickness of 5 nm) as the first upper interface layer 5, a ZnS—SiO$_2$ layer (thickness of about 5 nm, SiO$_2$:20 mol %) as the first upper protective layer 6, a GeN layer (thickness of 5 nm) as the first interface layer 7, an Ag alloy layer (thickness of 10 nm) as the first reflective layer 8, a GeN layer (thickness of 5 nm) as the first uppermost interface layer 9, and a ZnS—SiO$_2$ layer (thickness of about 30 nm, SiO$_2$:20 mol %) as the transmittance adjusting layer 10 were laminated on the polycarbonate substrate in this order by sputtering. As the materials of the first recording layer 4, (Ge$_{0.74}$Sn$_{0.26}$)$_8$Sb$_2$Te$_{11}$, (Sb$_{0.7}$Te$_{0.3}$)$_{95}$Ge$_5$, or (Sb$_{0.7}$Te$_{0.3}$)$_{90}$Ag$_5$In$_5$ were used. After the transmittance adjusting layer 10 was formed, an initialization process for crystallizing the entire surface of the first recording layer 4 was performed. Thus, three first information layers 11 having different compositions of the first recording layers 4 were produced.

Next, an ultraviolet ray curable resin that was not cured yet as the material of the optically separating layer 21 was applied to the second substrate 19 by spin coating. Then, the first information layer 11 was attached onto the resin, and the resin was cured by irradiation of ultraviolet rays. In this manner, a plurality of samples including the first recording layer 4 having different compositions were produced.

With respect to the thus produced samples, the transmittance of the first information layers 11 was measured in the same manner as in Example 1. Furthermore, with respect to these samples, the CNR and the erasure ratio of the first information layers 11 were measured in the same manner as in Example 2.

Table 4 shows the CNR and the erasure ratio of the first information layer 11 and the calculation results of (Tc+Ta)/2.

TABLE 4

| Sample No. | Composition of first recording layer 4 | (Tc + Ta)/2 [%] | CNR | Erasure ratio |
|---|---|---|---|---|
| 4-1 | $(Ge_{0.74}Sn_{0.26})_8Sb_2Te_{11}$ | B | B | B |
| 4-2 | $(Sb_{0.7}Te_{0.3})_{95}Ge_5$ | C | D | C |
| 4-3 | $(Sb_{0.7}Te_{0.3})_{90}Ag_5In_5$ | C | D | C |

B to D in Table 4 indicate the values of (Tc+Ta)/2, the CNR and the erasure ratio. To be specific, regarding (Tc+Ta)/2, 30%≦C<40%, and 40%≦B<50%. Regarding the CNR, D<40 (dB) and 50 (dB)≦B. Regarding the erasure ratio, 20 (dB)≦C<30 (dB), and 30 (dB)≦B.

As shown in Table 4, in the samples 4-2 and 4-3, all the transmittance, the CNR and the erasure ratio were insufficient. On the other hand, in the sample 4-1, good results of a transmittance of 45%, a CNR of 50 dB and an erasure ratio of 30 dB were obtained. From the above results, the material represented by a composition formula $(Ge_{0.74}Sn_{0.26})_8Sb_2Te_{11}$ is preferable as the material of the first recording layer 4.

With respect to the first information layer 25 of the information recording medium 26 of FIG. 2, the erasure ratio, the CNR and the transmittance were measured in the same manner. The same results as above were obtained.

Example 4

In Example 4, the relationship between the characteristics of the second information layer 20 and the material of the second recording layer 14 was examined. More specifically, the second information layers 20 including the second recording layer 14 having varied compositions were produced, and the first substrates 1 and the second information layers 20 were attached via the optically separating layers 21 to produce samples. With respect to the formed samples, the recording sensitivity, the CNR and the reflectance of the second information layers 20 were measured.

A method for producing the samples will be described below. First, a polycarbonate substrate (a diameter of 120 mm and a thickness of 0.6 mm) was prepared as the second substrate 19. Then, an Al alloy layer (thickness of 80 nm) as the second reflective layer 18, a ZnS—SiO$_2$ layer (thickness of about 10 nm, SiO$_2$:20 mol %) as the second upper protective layer 16, a GeN layer (thickness of 5 nm) as the second upper interface layer 15, a second recording layer 14 (thickness of 10 nm), a GeN layer (thickness of 5 nm) as the second lower interface layer 13, and a ZnS—SiO$_2$ layer (thickness of about 60 nm) as the second lower protective layer 12 were laminated on the polycarbonate substrate in this order by sputtering. As the materials of the second recording layer 14, $(Ge_{0.74}Sn_{0.26})_8Sb_2Te_{11}$, $(Sb_{0.7}Te_{0.3})_{95}Ge_5$, or $(Sb_{0.7}Te_{0.3})_{90}Ag_5In_5$ were used.

The thicknesses of the second lower protective layer 12 and the second upper protective layer 16 were determined exactly from calculations based on a matrix method such that the following was achieved. At a wavelength of 405 nm, the amount of reflected light when the second recording layer 14 was in the crystalline phase was larger than that when the second recording layer 14 was in the amorphous phase; a change in the amount of reflected light between when the second recording layer 14 was in the crystalline phase and when it was in the amorphous phase was large; and the light absorption efficiency of the second recording layer 14 was large.

Next, an initialization process for crystallizing the entire surface of the second recording layer 14 was performed. Then, an ultraviolet ray curable resin as the material of the optically separating layer 21 was applied to the first substrate 1 by spin coating. Then, the second information layer 20 was attached onto the resin, and the resin was cured by irradiation of ultraviolet rays. In this manner, a plurality of samples including the second recording layer 14 having different compositions were produced.

With respect to the thus produced samples, the reflectance of the specular portion of the substrate was measured. Furthermore, with respect to these samples, the recording sensitivity and the CNR of the second information layer 20 were measured with the apparatus of FIG. 4. In this case, the wavelength of the laser beam 23 was 405 nm, the NA of the objective lens 28 was 0.65, the linear velocity of the samples at measurement was 8.6 m/s, and the shortest mark length was 0.294 µm. Information was recorded in the grooves. Herein, "the recording sensitivity" refers to a value defined by the peak power Pp (mW) that is 130% of the peak power Pp (mW) that provides an amplitude 3 dBm lower than the saturated value of an amplitude (dBm) (this applies to the following examples). As the value of the recording sensitivity becomes smaller, information can be recorded with a lower laser power. The average (Tc+Ta)/2 of the transmittance of the first information layer 11 is about 40%, and the largest power of the semiconductor laser 29 incident to the first substrate 1 is about 12 mW Therefore, the laser power that reaches the second information layer 20 is about 5 mW. For this reason, it is preferable that the recording sensitivity of the second information layer 20 is 5 mW or less.

Table 5 shows the measurement results of the recording sensitivity, the CNR of the second information layer 20 and the reflectance when the second recording layer 14 is in the crystalline phase.

TABLE 5

| Sample No. | Composition of second recording layer 14 | Recording sensitivity | Reflectance | CNR |
|---|---|---|---|---|
| 5-1 | $(Ge_{0.74}Sn_{0.26})_8Sb_2Te_{11}$ | D | C | B |
| 5-2 | $(Sb_{0.7}Te_{0.3})_{95}Ge_5$ | B | B | B |
| 5-3 | $(Sb_{0.7}Te_{0.3})_{90}Ag_5In_5$ | B | B | B |

B to D in Table 5 indicate the values of the recording sensitivity, the CNR and the reflectance. To be specific, regarding the recording sensitivity, 5 (mW)<D, and B≦5 (mW). Regarding the CNR, 50 (dB)≦B. Regarding the reflectance, 10%≦C<20%, and 20%≦B<30%. It is preferable that in the second information layer 20, the CNR is 40 dB or more, and more preferably 50 dB or more. The reflectance preferably is 10% or more, and more preferably 20% or more.

As shown in Table 5, in the sample 5-1, at a recording power of 5 mW or less, the CNR was not saturated, the recording sensitivity was not sufficient, and the reflectance was insufficient. In the samples 5-2 and 5-3 comprising $(Sb_{0.7}Te_{0.3})_{95}Ge_5$ or $(Sb_{0.7}Te_{0.3})_{90}Ag_5In_5$, which have low melting points, the recording sensitivity is 5 mW or less, and the CNR was high at the same time.

With respect to the second information layer 20 of the information recording medium 26 of FIG. 3, the recording sensitivity was measured in the same manner. The same results as above were obtained.

configuration other than the recording layer and the optically separating layer and the production conditions were the same as those in Examples 3 and 4.

With respect to the thus obtained samples, the CNR and the erasure ratio of the first information layer 11 were measured. Furthermore, the recording sensitivity, the reflectance and the CNR of the second information layer 20 were measured. These measurements were performed in the same manner as described in the above-described examples. Table 6 shows the measurement results.

TABLE 6

| Sample No. | 6-1 | 6-2 | 6-3 |
|---|---|---|---|
| Composition of first recording layer 4 | $(Ge_{0.74}Sn_{0.26})_8Sb_2Te_{11}$ | $(Ge_{0.74}Sn_{0.26})_8Sb_2Te_{11}$ | $(Sb_{0.7}Te_{0.3})_{95}Ge_5$ |
| Composition of second recording layer 14 | $(Ge_{0.74}Sn_{0.26})_8Sb_2Te_{11}$ | $(Sb_{0.7}Te_{0.3})_{95}Ge_5$ | $(Sb_{0.7}Te_{0.3})_{95}Ge_5$ |
| First information layer 11 | | | |
| (Tc + Ta)/2 [%] | B | B | C |
| CNR | B | B | D |
| Erasure ratio | B | B | C |
| Second information layer 20 | | | |
| Recording sensitivity | D | B | D |
| Reflectance | C | B | C |
| CNR | B | B | C |

Example 5

In Example 5, the information recording medium 22 of FIG. 1 was produced based on the results of Examples 3 and 4. Then, with respect to the produced information recording medium 22, the transmittance, the CNR, and the erasure ratio of the first information layer 11, and the recording sensitivity, the reflectance and the CNR of the second information layer 20 were measured.

In Example 5, the compositions of the first recording layer 4 and the second recording layer 14 were $(Ge_{0.74}Sn_{0.26})_8Sb_2Te_{11}$ or $(Sb_{0.7}Te_{0.3})_{95}Ge_5$. The thickness of the first recording layer 4 was 6 nm and the thickness of the second recording layer 14 was 10 nm.

With respect to the first information layer 11, after all the layers thereof were formed, an initialization process was performed. With respect to the first information layer 11, the transmittance was measured before and after the initialization process. Also with respect to the second information layer 20, after all the layers thereof were formed, an initialization process was performed. Thereafter, an ultraviolet ray curable resin that was not cured yet as the material of the optically separating layer 21 was applied to the second lower protective layer 12 by spin coating. Then, the first information layer 11 and the second information layer 20 were attached tightly. Then, the resin was cured by irradiation of ultraviolet rays. In this manner, samples (information recording media 22) including the first information layers 11 and the second information layers 20 were produced. The B to D in Table 6 indicate the results of the measurements. Regarding the values of (Tc+Ta)/2, $30\% \leq C \leq 40\%$, and $40\% \leq B \leq 50\%$. Regarding the CNR, D<40 (dB), 40 (dB) $\leq C<50$ (dB), and 50 (dB)$\leq B$. Regarding the erasure ratio, 20 (dB)$\leq C<30$ (dB), and 30 (dB)$\leq B$. Regarding recording sensitivity, 12 (mW)<D, $B \leq 12$ (mW). The reflectance in Table 6 is the reflectance of the second information layer 20 when the second recording layer 14 is in the crystalline phase, and $10\% \leq C<20\%$, and $20\% \leq B<30\%$.

In sample 6-1, the compositions of the first recording layer 4 and the second recording layer 14 were $(Ge_{0.74}Sn_{0.26})_8Sb_2Te_{11}$. In sample 6-2, the composition of the first recording layer 4 was $(Ge_{0.74}Sn_{0.26})_8Sb_2Te_{11}$, and the composition of the second recording layer 14 was $(Sb_{0.7}Te_{0.3})_{95}Ge_5$. In sample 6-3, the compositions of the first recording layer 4 and the second recording layer 14 were $(Sb_{0.7}Te_{0.3})_{95}Ge_5$.

As shown in Table 6, in the sample 6-1, as in the results of Example 4, the recording sensitivity and the reflectance of the second information layer 20 were insufficient. In the sample 6-3, as in the results of Example 3, the transmittance, the CNR and the erasure ratio were insufficient, and the transmittance of the first information layer 11 was not sufficient, so that the recording sensitivity, the reflectance and the CNR of the second information layer 20 were reduced. On the other hand, in the sample 6-2, in both the first information layer 11 and the second information layer 20, good results of a CNR of 50 dB or more and an erasure ratio of 30 dB or more were obtained.

In the above-described examples, information was recorded in the grooves. Furthermore, the same measurements were conducted with respect to the case where information was recorded in lands, and the case where information was recorded in lands and grooves. Then, the same results as above were obtained.

Example 6

In Example 6, the information recording medium 26 of FIG. 3 was produced by the method of Embodiment 4. Then, with respect to the produced information recording medium 26, the CNR and the erasure ratio of the first information layer 25, and the erasure ratio and the CNR of the second information layer 20 were measured.

A method for producing samples will be described below. First, a polycarbonate substrate (a diameter of 120 mm and a thickness of 1.1 mm) was prepared as the second substrate 19. Then, an Al alloy layer (thickness of 80 nm) as the second reflective layer 18, a ZnS—SiO$_2$ layer (thickness of about 10 nm, SiO$_2$:20 mol %) as the second upper protective layer 16, a GeN layer (thickness of 5 nm) as the second upper interface layer 15, a (Sb$_{0.7}$Te$_{0.3}$)$_{95}$Ge$_5$ layer (thickness of 10 nm) as the second recording layer 14, a GeN layer (thickness of 5 nm) as the second lower interface layer 13, and a ZnS—SiO$_2$ layer (thickness of about 60 nm, SiO$_2$:20 mol %) as the second lower protective layer 12 were laminated on the polycarbonate substrate in this order by sputtering. Thereafter, an initialization process for crystallizing the entire surface of the second recording layer 14 was performed.

Then, an ultraviolet ray curable resin was applied to the second lower protective layer 12 by spin coating, and a substrate provided with guide grooves was overlapped thereon. After the resin was cured, the substrate was removed. In this process, the optically separating layer 21 in which guide grooves for guiding the laser beam 23 were formed on the side of the first information layer 25 was formed.

Thereafter, a ZnS—SiO$_2$ layer (thickness of about 30 nm, SiO$_2$:20 mol %) as the transmittance adjusting layer 10, a GeN layer (thickness of 3 nm) as the first uppermost interface layer 9, an Ag alloy layer (thickness of 10 nm) as the first reflective layer 8, a GeN layer (thickness of 5 nm) as the first interface layer 7, a ZnS—SiO$_2$ layer (thickness of about 5 nm, SiO$_2$:20 mol %) as the first upper protective layer 6, a GeN layer (thickness of 5 nm) as the first upper interface layer 5, a (Ge$_{0.74}$Sn$_{0.26}$)$_8$Sb$_2$Te$_{11}$ layer (thickness of 6 nm) as the first recording layer 4, a GeN layer (thickness of 5 nm) as the first lower interface layer 3, and a ZnS—SiO$_2$ layer (thickness of about 40 nm, SiO$_2$:20 mol %) as the first lower protective layer 2 were laminated on the optically separating layer 21 in this order by sputtering. Thereafter, an initialization process for crystallizing the entire surface of the first recording layer 4 was performed.

Next, a polycarbonate substrate (a diameter of 120 mm and a thickness of 0.1 mm) was prepared as the first substrate 1. Then an ultraviolet ray curable resin as the material of the transparent layer 24 was applied to the first substrate 1 by spin coating. Then, the first lower protective layer 2 was attached onto the resin, and the resin was cured by irradiation of ultraviolet rays. In this manner, samples (information recording media 26) were produced.

With respect to the thus produced samples, the CNR and the erasure ratio of the first information layer 25 and the second information layer 20 were measured with the apparatus of FIG. 4. In this case, the wavelength of the laser beam 23 was 405 nm, the NA of the objective lens 28 was 0.85, the linear velocity of the information recording medium 26 at measurement was 5.0 m/s, and the shortest mark length was 0.206 μm. Information was recorded in the grooves. As a result, both in the first information layer 25 and the second information layer 20, good results of a CNR of 50 dB or more and an erasure ratio of 30 dB or more were obtained.

Example 7

For the material of the second recording layer 14, Sn, Se, Bi, Au or Mn were added as M1, instead of Ag, In and Ge. Then, the same measurements as in Examples 4, 5, and 6 were conducted. As a result, the same effects as in Examples 4, 5, and 6 were obtained.

Example 8

In Example 8, the information recording medium 41 of FIG. 5 was produced, and the phase change in the recording layer by application of electrical energy (current pulse) was examined.

First, a Si substrate whose surface was treated with nitrogen was prepared as the substrate 31. Then, a Au layer (area: 1.0 mm×1.0 mm, a thickness of 0.1 μm) as the first electrode 32, a (Ge$_{0.74}$Sn$_{0.26}$)$_8$Sb$_2$Te$_{11}$ layer (area: 0.6 mm×0.6 mm, a thickness of 0.5 μm) as the first recording layer 33, a Au layer (area: 0.6 mm×0.6 mm, a thickness of 0.1 μm) as the intermediate electrode 34, a (Sb$_{0.7}$Te$_{0.3}$)$_{95}$Ge$_5$ layer (area: 0.2 mm×0.2 mm, a thickness of 0.5 μm) as the second recording layer 35, and a Au layer (area: 0.2 mm×0.2 mm, a thickness of 0.1 μm) as the second electrode 36 were laminated on the Si substrate in this order by sputtering.

Thereafter, a lead wire made of Au was bonded to the first electrode 32, the intermediate electrode 34, and the second electrode 36. A pulse power supply 37 was connected between the first electrode 32 and the second electrode 36, and between the intermediate electrode 34 and the second electrode 36 via a switch 39. A change in the resistance due to the phase change of the first information layer 33 and the second recording layer 35 was detected by a resistance meter 38 connected between the first electrode 32 and the second electrode 36 via a switch 40.

When both the first recording layer 33 and the second recording layer 35 are in a high resistive state (amorphous phase), a current pulse with an amplitude of 50 mA and a pulse width of 100 ns was applied between the first electrode 32 and the second electrode 36. Then, the two recording layers were changed to a low resistive state (crystalline phase). Next, when a current pulse with an amplitude of 150 mA and a pulse width of 50 ns was applied between the first electrode 32 and the second electrode, only the second recording layer 35 was changed from a low resistive state to a high resistive state. When both the first recording layer 33 and the second recording layer 35 were in a low resistive state, a current pulse with an amplitude of 200 mA and a pulse width of 50 ns was applied between the first electrode 32 and the second electrode 36. Then, the two recording layers were changed from a low resistive state to a high resistive state. When both the first recording layer 33 and the second recording layer 35 were in a high resistive state, a current pulse with an amplitude of 50 mA and a pulse width of 100 ns was applied between the intermediate electrode 34 and the second electrode 36. Then, only the second recording layer 35 was changed from a high resistive state to a low resistive state.

As described above, in the information recording medium 41 of FIG. 5, each of the first recording layer 33 and the second recording layer 35 electrically was changed reversibly between the crystalline phase and the amorphous phase.

As a result, the following four states were attained: both the first recording layer 33 and the second recording layer 35 were in a high resistive state; the first recording layer 33 was in a low resistive state and the second recording layer 35 was in a high resistive state; the first recording layer 33 was in a high resistive state and the second recording layer 35 was in a low resistive state; and both the first recording layer 33 and the second recording layer 35 were in a low resistive state.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An information recording medium comprising a first information layer and a second information layer, wherein the first information layer comprises a first recording layer in which a reversible phase change is caused between a crystalline phase and an amorphous phase by irradiation of a laser beam or Joule heat generated by application of current, the second information layer comprises a second recording layer in which a reversible phase change is caused between a crystalline phase and an amorphous phase by the irradiation of the laser beam or the Joule heat generated by the application of the current, the first recording layer is made of a first material that comprises Ge, Sb, and Te, the second recording layer is made of a second material that comprises Sb, Te, and at least one element M1 selected from the group consisting of Ag, In, Ge, Sn, Se, Bi, Au and Mn, and the first material is different from the second material.

2. The information recording medium according to claim 1, wherein the first material is represented by a composition formula:

$Ge_a Sb_b Te_{3+a}$, where $0 < a \leq 10$ and $1.5 \leq b \leq 4$.

3. The information recording medium according to claim 1, wherein the first material is represented by a composition formula:

$(Ge-M2)_a Sb_b Te_{3+a}$, where M2 is at least one element selected from the group consisting of Sn and Pb, and $0 < a \leq 10$ and $1.5 \leq b \leq 4$.

4. The information recording medium according to claim 1, wherein the first material is represented by a composition formula:

$(Ge_a Sb_b Te_{3+a})_{100-c} M3_c$, where M3 is at least one element selected from the group consisting of Si, Ti, V, Cr, Mn, Fe, Co, Ni, Cu, Se, Zr, Nb, Mo, Ru, Rh, Pd, Ag, In, Sn, Ta, W, Os, Ir, Pt, Au and Bi, and $0 < a \leq 10$, $1.5 \leq b \leq 4$, and $0 < c \leq 20$.

5. The information recording medium according to claim 1, wherein the second material is represented by a composition formula:

$(Sb_x Te_{100-x})_{100-y} M1_y$, where $50 \leq x \leq 95$ and $0 < y \leq 20$.

6. The information recording medium according to claim 1, wherein in the first and second recording layers, a reversible phase change is caused by the irradiation of the laser beam, and the first information layer is disposed closer to a side from which the laser beam is incident than the second information layer.

7. The information recording medium according to claim 1, further comprising first and second electrodes, wherein in the first and second recording layers, a reversible phase change is caused by the application of the current, and the first recording layer, the second recording layer and the second electrode are laminated over the first electrode in this order.

8. The information recording medium according to claim 7, further comprising an intermediate electrode disposed between the first recording layer and the second recording layer.

* * * * *

UNITED STATES PATENT AND TRADEMARK OFFICE
CERTIFICATE OF CORRECTION

PATENT NO. : 6,670,014 B2
DATED : December 30, 2003
INVENTOR(S) : Nishihara et al.

It is certified that error appears in the above-identified patent and that said Letters Patent is hereby corrected as shown below:

<u>Title page,</u>
Item [56], References Cited, FOREIGN PATENT DOCUMENTS, "JP 1-195243 7/1999" should read -- JP 11-195243 7/1999 --; "JP 2000-36130 2/2001" should read -- JP 2-147289 5/2001" should read -- JP 2-147289 6/1990 --

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,670,014 B2
DATED         : December 30, 2003
INVENTOR(S)   : Nishihara et al.

It is certified that error appears in the above-identified patent and that said Letters Patent is hereby corrected as shown below:

Title page,
Item [56], References Cited, FOREIGN PATENT DOCUMENTS, "JP 2000-36130 2/2001" should read -- JP 2000-36130 2/2000 --; "JP 2-147289 5/2001" should read -- JP 2-147289 6/1990 --

Signed and Sealed this

Twenty-eighth Day of September, 2004

JON W. DUDAS
*Director of the United States Patent and Trademark Office*